(12) United States Patent
Yamazaki et al.

(10) Patent No.: US 8,008,693 B2
(45) Date of Patent: Aug. 30, 2011

(54) SEMICONDUCTOR THIN FILM AND METHOD OF MANUFACTURING THE SAME AND SEMICONDUCTOR DEVICE AND METHOD OF MANUFACTURING THE SAME

(75) Inventors: Shunpei Yamazaki, Tokyo (JP); Jun Koyama, Kanagawa (JP); Akiharu Miyanaga, Kanagawa (JP); Takeshi Fukunaga, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 107 days.

(21) Appl. No.: 11/670,462

(22) Filed: Feb. 2, 2007

(65) Prior Publication Data

US 2007/0252206 A1 Nov. 1, 2007

Related U.S. Application Data

(60) Continuation of application No. 10/843,613, filed on May 12, 2004, now Pat. No. 7,172,929, and a division of application No. 08/805,952, filed on Feb. 24, 1997, now Pat. No. 6,787,806.

(30) Foreign Application Priority Data

Feb. 23, 1996 (JP) .................................. 8-061895
Feb. 23, 1996 (JP) .................................. 8-061896

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ................ 257/288; 257/384; 257/E29.132; 438/292; 438/308

(58) Field of Classification Search .................... 437/41; 156/643; 257/288, 384, E29.132, E29.162; 438/292, 308
See application file for complete search history.

(56) References Cited

U.S. PATENT DOCUMENTS 3,964,941 A     6/1976  Wang
(Continued)

FOREIGN PATENT DOCUMENTS

EP           0 485 233 A2     5/1992
(Continued)

OTHER PUBLICATIONS

Shimokawa et al., "Characterization of High-Efficiency Cast-Si Solar Cell Wafers by MBIC Measurement," Japanese Journal of Applied Physics, vol. 27; May 5, 1988; pp. 751-758.

(Continued)

*Primary Examiner* — Phuc T Dang
(74) *Attorney, Agent, or Firm* — Eric J. Robinson; Robinson Intellectual Property Law Office, P.C.

(57) ABSTRACT

A thin film semiconductor transistor structure has a substrate with a dielectric surface, and an active layer made of a semiconductor thin film exhibiting a crystallinity as equivalent to the single-crystalline. To fabricate the transistor, the semiconductor thin film is formed on the substrate, which film includes a mixture of a plurality of crystals which may be columnar crystals and/or capillary crystal substantially parallel to the substrate. The resultant structure is then subject to thermal oxidation in a chosen atmosphere containing halogen, thereby removing away any metallic element as contained in the film. This may enable formation of a monodomain region in which the individual columnar or capillary crystal is in contact with any adjacent crystals and which is capable of being substantially deemed to be a single-crystalline region without presence or inclusion of any crystal grain boundaries therein. This region is for use in forming the active layer of the transistor.

42 Claims, 17 Drawing Sheets

U.S. PATENT DOCUMENTS

| | | |
|---|---|---|
| 4,104,675 A | 8/1978 | DiMaria |
| 4,217,153 A | 8/1980 | Fukunaga et al. |
| 4,231,809 A | 11/1980 | Schmidt |
| 4,583,122 A | 4/1986 | Ohwada et al. |
| 4,665,419 A | 5/1987 | Sasaki |
| 4,690,730 A * | 9/1987 | Tang et al. .................. 438/649 |
| 4,733,947 A | 3/1988 | Ota et al. |
| 4,753,896 A | 6/1988 | Matloubian |
| 4,768,076 A | 8/1988 | Aoki et al. |
| 4,786,955 A | 11/1988 | Plus et al. |
| 4,822,752 A | 4/1989 | Sugahara et al. |
| 4,857,986 A | 8/1989 | Kinugawa |
| 4,888,305 A | 12/1989 | Yamazaki |
| 4,899,202 A | 2/1990 | Blake et al. |
| 4,904,611 A | 2/1990 | Chiang |
| 4,905,072 A | 2/1990 | Komatsu |
| 4,906,587 A * | 3/1990 | Blake ......................... 438/151 |
| 4,933,298 A | 6/1990 | Hasegawa |
| 4,943,837 A | 7/1990 | Konishi et al. |
| 5,002,630 A | 3/1991 | Kermani et al. |
| 5,059,304 A | 10/1991 | Field |
| 5,089,441 A | 2/1992 | Moslehi |
| 5,130,770 A | 7/1992 | Blanc et al. |
| 5,147,826 A | 9/1992 | Liu |
| 5,215,931 A | 6/1993 | Houston |
| 5,243,213 A | 9/1993 | Miyazawa et al. |
| 5,258,323 A | 11/1993 | Sarma et al. |
| 5,261,999 A | 11/1993 | Pinker et al. |
| 5,275,851 A | 1/1994 | Fonash |
| 5,317,236 A | 5/1994 | Zavracky et al. |
| 5,341,028 A | 8/1994 | Yamaguchi et al. |
| 5,371,037 A | 12/1994 | Yonehara |
| 5,374,564 A | 12/1994 | Bruel |
| 5,387,555 A | 2/1995 | Linn et al. |
| 5,403,759 A | 4/1995 | Havemann |
| 5,403,772 A | 4/1995 | Zhang |
| 5,424,230 A | 6/1995 | Wakai |
| 5,426,062 A | 6/1995 | Hwang |
| 5,426,064 A | 6/1995 | Zhang |
| 5,444,282 A | 8/1995 | Yamaguchi et al. |
| 5,481,121 A | 1/1996 | Zhang |
| 5,488,000 A | 1/1996 | Zhang |
| 5,492,843 A | 2/1996 | Adachi |
| 5,501,989 A | 3/1996 | Takayama |
| 5,508,209 A | 4/1996 | Zhang et al. |
| 5,508,533 A | 4/1996 | Takemura |
| 5,529,937 A | 6/1996 | Zhang |
| 5,534,716 A | 7/1996 | Takemura |
| 5,543,352 A | 8/1996 | Ohtani |
| 5,548,153 A | 8/1996 | Muragishi |
| 5,550,070 A | 8/1996 | Funai |
| 5,563,426 A | 10/1996 | Zhang |
| 5,569,610 A | 10/1996 | Zhang |
| 5,569,620 A | 10/1996 | Linn et al. |
| 5,569,936 A | 10/1996 | Zhang |
| 5,573,961 A | 11/1996 | Hsu et al. |
| 5,574,292 A | 11/1996 | Takahashi et al. |
| 5,576,556 A | 11/1996 | Takemura et al. |
| 5,580,792 A | 12/1996 | Zhang |
| 5,581,092 A | 12/1996 | Takemura |
| 5,581,102 A | 12/1996 | Kusumoto |
| 5,585,291 A | 12/1996 | Ohtani |
| 5,589,694 A | 12/1996 | Takayama |
| 5,595,923 A | 1/1997 | Zhang |
| 5,595,944 A | 1/1997 | Zhang |
| 5,604,360 A | 2/1997 | Zhang |
| 5,605,846 A | 2/1997 | Ohtani |
| 5,606,179 A | 2/1997 | Yamazaki |
| 5,608,232 A | 3/1997 | Yamazaki |
| 5,612,230 A | 3/1997 | Yuzurihara et al. |
| 5,612,250 A | 3/1997 | Ohtani |
| 5,614,426 A | 3/1997 | Funada |
| 5,614,733 A | 3/1997 | Zhang |
| 5,616,506 A | 4/1997 | Takemura |
| 5,619,044 A | 4/1997 | Makita |
| 5,620,910 A | 4/1997 | Teramoto |
| 5,621,224 A | 4/1997 | Yamazaki |
| 5,624,851 A | 4/1997 | Takayama |
| 5,637,515 A | 6/1997 | Takemura |
| 5,639,698 A | 6/1997 | Yamazaki |
| 5,640,033 A * | 6/1997 | Matsuoka .................... 257/333 |
| 5,643,826 A | 7/1997 | Ohtani |
| 5,646,424 A | 7/1997 | Zhang |
| 5,648,277 A | 7/1997 | Zhang et al. |
| 5,654,203 A | 8/1997 | Ohtani |
| 5,656,825 A | 8/1997 | Kusumoto |
| 5,663,077 A | 9/1997 | Adachi |
| 5,663,578 A * | 9/1997 | Hsu et al. ..................... 257/66 |
| 5,677,549 A | 10/1997 | Takayama |
| 5,693,959 A | 12/1997 | Inoue et al. |
| 5,696,003 A | 12/1997 | Makita et al. |
| 5,696,386 A | 12/1997 | Yamazaki |
| 5,696,388 A | 12/1997 | Funada |
| 5,698,869 A * | 12/1997 | Yoshimi et al. ............. 257/192 |
| 5,700,333 A | 12/1997 | Yamazaki |
| 5,700,349 A * | 12/1997 | Tsukamoto et al. ......... 438/637 |
| 5,705,829 A | 1/1998 | Miyanaga |
| 5,710,057 A | 1/1998 | Kenney |
| 5,712,191 A | 1/1998 | Nakajima |
| 5,714,395 A | 2/1998 | Bruel |
| 5,719,065 A | 2/1998 | Takemura et al. |
| 5,728,619 A * | 3/1998 | Tsai et al. .................... 438/297 |
| 5,744,822 A | 4/1998 | Takayama |
| 5,744,824 A | 4/1998 | Kousai |
| 5,750,000 A | 5/1998 | Yonehara et al. |
| 5,756,364 A | 5/1998 | Tanaka |
| 5,766,977 A | 6/1998 | Yamazaki |
| 5,773,327 A | 6/1998 | Yamazaki |
| 5,773,846 A | 6/1998 | Zhang |
| 5,773,847 A | 6/1998 | Hayakawa |
| 5,778,237 A | 7/1998 | Yamamoto et al. |
| 5,784,132 A | 7/1998 | Hashimoto |
| 5,793,073 A | 8/1998 | Kaminishi et al. |
| 5,795,795 A | 8/1998 | Kousai |
| 5,808,321 A | 9/1998 | Mitanaga |
| 5,811,327 A | 9/1998 | Funai |
| 5,817,550 A | 10/1998 | Carey et al. ................. 438/166 |
| 5,818,076 A | 10/1998 | Zhang |
| 5,821,138 A | 10/1998 | Yamazaki |
| 5,821,562 A | 10/1998 | Makita et al. |
| 5,821,563 A | 10/1998 | Yamazaki et al. ............. 257/66 |
| 5,824,574 A | 10/1998 | Yamazaki |
| 5,837,569 A | 11/1998 | Makita et al. |
| 5,840,616 A | 11/1998 | Sakaguchi et al. |
| 5,841,173 A * | 11/1998 | Yamashita ................... 257/384 |
| 5,849,627 A | 12/1998 | Linn et al. |
| 5,854,123 A | 12/1998 | Sato et al. |
| 5,854,509 A | 12/1998 | Kunikiyo |
| 5,886,385 A | 3/1999 | Arisumi et al. |
| 5,893,730 A | 4/1999 | Yamazaki et al. |
| 5,899,711 A | 5/1999 | Smith |
| 5,904,528 A * | 5/1999 | Lin et al. ..................... 438/286 |
| 5,913,111 A | 6/1999 | Kataoka et al. |
| 5,923,962 A | 7/1999 | Ohtani et al. |
| 5,926,430 A | 7/1999 | Noda et al. |
| 5,937,304 A | 8/1999 | Yoshinouchi et al. ....... 438/308 |
| 5,943,105 A | 8/1999 | Fujikawa et al. |
| 5,949,107 A | 9/1999 | Zhang |
| 5,953,622 A | 9/1999 | Lee et al. |
| 5,962,897 A | 10/1999 | Takemura et al. |
| 5,966,594 A | 10/1999 | Adachi et al. |
| 5,966,620 A | 10/1999 | Sakaguchi et al. |
| 5,982,002 A | 11/1999 | Takasu et al. |
| 5,985,681 A | 11/1999 | Hamajima et al. |
| 5,985,740 A | 11/1999 | Yamazaki |
| 6,020,252 A | 2/2000 | Aspar et al. |
| 6,031,249 A | 2/2000 | Yamazaki et al. |
| 6,049,092 A | 4/2000 | Konuma et al. |
| 6,051,453 A | 4/2000 | Takemura |
| 6,054,363 A | 4/2000 | Sakaguchi et al. |
| 6,071,764 A | 6/2000 | Zhang et al. |
| 6,077,731 A | 6/2000 | Yamazaki et al. |
| 6,077,758 A | 6/2000 | Zhang et al. |
| 6,093,935 A | 7/2000 | Kusumoto |
| 6,093,937 A | 7/2000 | Yamazaki et al. |
| 6,096,582 A | 8/2000 | Inoue et al. |
| 6,118,148 A | 9/2000 | Yamazaki |

| | | |
|---|---|---|
| 6,127,702 A | 10/2000 | Yamazaki et al. |
| 6,133,073 A | 10/2000 | Yamazaki et al. |
| 6,140,667 A | 10/2000 | Yamazaki et al. |
| 6,157,421 A | 12/2000 | Ishii |
| 6,162,667 A | 12/2000 | Funai et al. |
| 6,191,476 B1 | 2/2001 | Takahashi et al. |
| 6,198,143 B1 * | 3/2001 | Ohsaki .......................... 257/412 |
| 6,207,969 B1 | 3/2001 | Yamazaki |
| 6,218,678 B1 | 4/2001 | Zhang et al. |
| 6,262,438 B1 | 7/2001 | Yamazaki et al. |
| 6,287,900 B1 | 9/2001 | Yamazaki et al. |
| 6,291,275 B1 | 9/2001 | Yamazaki et al. |
| 6,294,478 B1 | 9/2001 | Sakaguchi et al. |
| 6,365,933 B1 | 4/2002 | Yamazaki et al. |
| 6,380,560 B1 | 4/2002 | Yamazaki et al. |
| 6,388,291 B1 | 5/2002 | Zhang et al. |
| 6,421,754 B1 | 7/2002 | Kau et al. |
| 6,433,361 B1 | 8/2002 | Zhang et al. |
| 6,455,401 B1 | 9/2002 | Zhang et al. |
| 6,458,637 B1 | 10/2002 | Yamazaki et al. |
| 6,465,287 B1 | 10/2002 | Yamazaki et al. |
| 6,528,820 B1 | 3/2003 | Yamazaki et al. |
| 6,590,230 B1 | 7/2003 | Yamazaki et al. |
| 6,617,612 B2 | 9/2003 | Zhang et al. |
| 6,683,350 B1 | 1/2004 | Kusumoto |
| 6,787,806 B1 | 9/2004 | Yamazaki et al. |
| 6,849,872 B1 | 2/2005 | Yamazaki et al. |
| 6,867,431 B2 | 3/2005 | Konuma et al. |
| 6,924,213 B2 | 8/2005 | Zhang et al. |
| 7,011,993 B2 | 3/2006 | Kusumoto |
| 7,056,775 B2 | 6/2006 | Zhang et al. |
| RE39,484 E | 2/2007 | Bruel |
| 7,172,929 B2 | 2/2007 | Yamazaki et al. |
| 7,223,666 B2 | 5/2007 | Ohtani et al. |
| 7,381,599 B2 | 6/2008 | Konuma et al. |
| 2004/0104435 A1 | 6/2004 | Ohtani et al. |
| 2004/0256621 A1 | 12/2004 | Konuma et al. |
| 2005/0142705 A1 | 6/2005 | Konuma et al. |
| 2005/0153489 A1 | 7/2005 | Konuma et al. |
| 2006/0091386 A1 | 5/2006 | Kusumoto |
| 2007/0007529 A1 | 1/2007 | Takemura et al. |
| 2007/0020888 A1 | 1/2007 | Yamazaki et al. |
| 2007/0210451 A1 | 9/2007 | Ohtani et al. |
| 2007/0252206 A1 | 11/2007 | Yamazaki et al. |

FOREIGN PATENT DOCUMENTS

| | | |
|---|---|---|
| EP | 0 723 286 | 7/1996 |
| JP | 63-318779 A | 12/1988 |
| JP | 64-35959 | 2/1989 |
| JP | 01-264254 A | 10/1989 |
| JP | 02-042725 A | 2/1990 |
| JP | 03-079035 A | 4/1991 |
| JP | 04-206766 A | 7/1992 |
| JP | 04-348532 A | 12/1992 |
| JP | 05-074763 | 3/1993 |
| JP | 05-211128 A | 8/1993 |
| JP | 05-218410 | 8/1993 |
| JP | 05-226620 A | 9/1993 |
| JP | 05-315355 | 11/1993 |
| JP | 06-132218 | 5/1994 |
| JP | 06-232059 | 8/1994 |
| JP | 6-232059 | 8/1994 |
| JP | 06-232158 | 8/1994 |
| JP | 6-244103 | 9/1994 |
| JP | 06-244103 | 9/1994 |
| JP | 07-094757 | 4/1995 |
| JP | 07-162002 | 6/1995 |
| JP | 07-192998 | 7/1995 |
| JP | 07-249749 A | 9/1995 |
| JP | 07-297122 | 11/1995 |
| JP | 07-297125 | 11/1995 |
| JP | 07-321339 | 12/1995 |
| JP | 7-321339 | 12/1995 |
| JP | 09-008124 A | 1/1997 |
| JP | 09-045882 A | 2/1997 |

OTHER PUBLICATIONS

Shimokawa et al., Characterization of High-Efficiency Cast-Si Solar Cell Wafers by MBIC Measurement; Japanese Journal of Applied Physics, vol. 27, May 5, 1988, pp. 751-758.

Bruel; "Silicon on Insulator Material Technology"; Electronics Letters; Jul. 1995; pp. 1201-1202; vol. 31, Issue 14.

Izumi et al.; "C.M.O.S. Devices Fabricated On Buried SiO2 Layers Formed By Oxygen Implantation Into Silicon"; Electronics Letters; Aug. 31, 1978; pp. 593-594; vol. 14, No. 18.

Wolf; "Silicon Processing for the VLSI ERA"; 1990; pp. 238-239; vol. 2; Lattice Press.

* cited by examiner

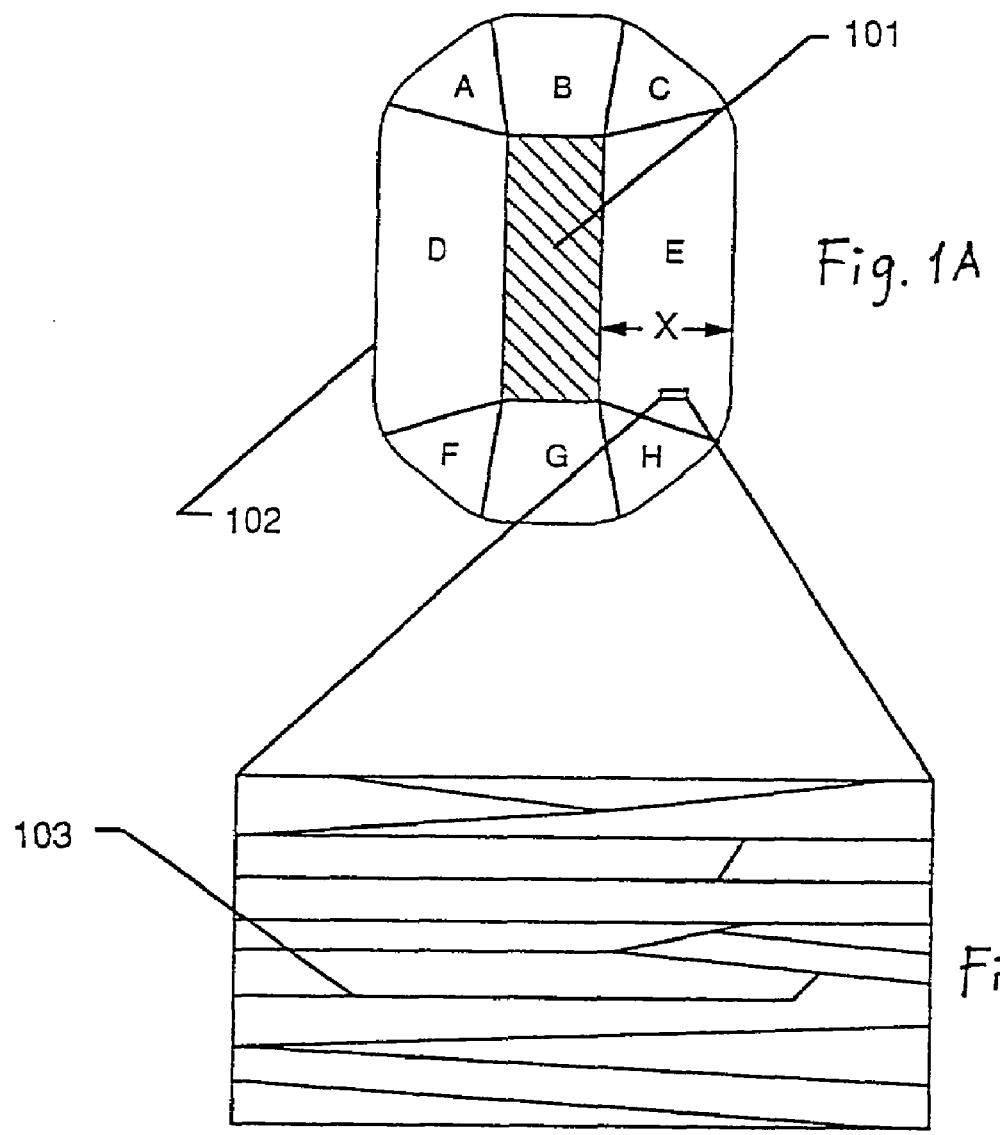
Fig. 1A
Fig. 1B
HEAT TREATMENT IN ATMOSPHERE CONTAINING HALOGEN
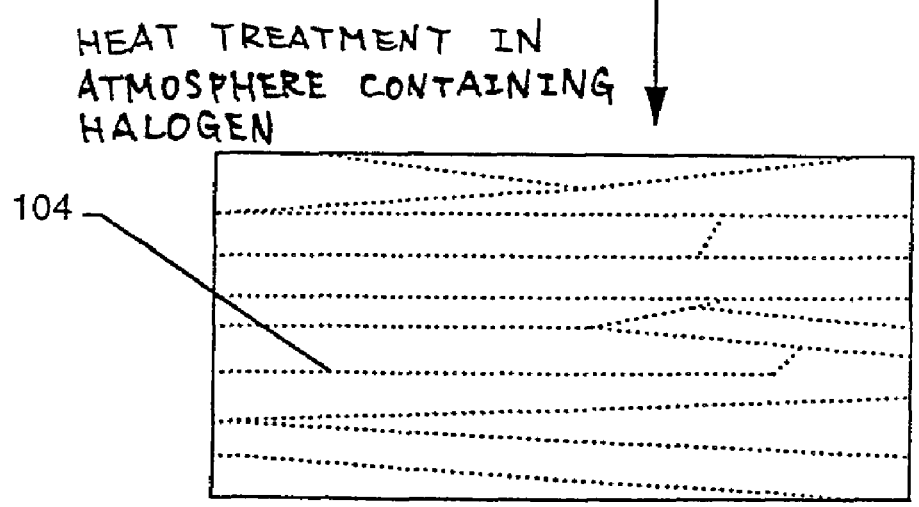
Fig. 1C

HEAT TREATMENT FOR CRYSTALLIZATION

REGION CONTAINING Ni AT HIGH CONCENTRATION

HEAT TREATMENT IN ATMOSPHERE CONTAINING HALOGEN ELEMENT

P ION IMPLANTATION

NTFT          PTFT

Fig. 15

| ELE-MENT | CONCENTRATION (ppm) | ELE-MENT | CONCENTRATION (ppm) |
|---|---|---|---|
| Fe | 0.045 | Ca | 0.16 |
| Ni | 0.016 | Mn | <0.001 |
| Na | >0.005 | Al | 0.004 |
| K | >0.004 | U *2 | <0.000031 |
| Ti *1 | <0.05 | Th *2 | <0.00016 |
| Mg | >0.005 | F *3 | 310 |
| Cu | 0.009 | Cl *2 | <0.73 |
| Cr | 0.003 | OH *4 | ND |

MEASUREMENT METHOD: POLARIZED ZEEMAN FLAMELESS ATOMIC ABSORPTION

NOTES)
*1 ... ICP EMISSION ANALYSIS

*2 ... RADIOACTIVATION ANALYSIS

*3 ·· EPMA

*4 ... INFRARED ABSORPTION

IMPURITY ION IMPLANTATION

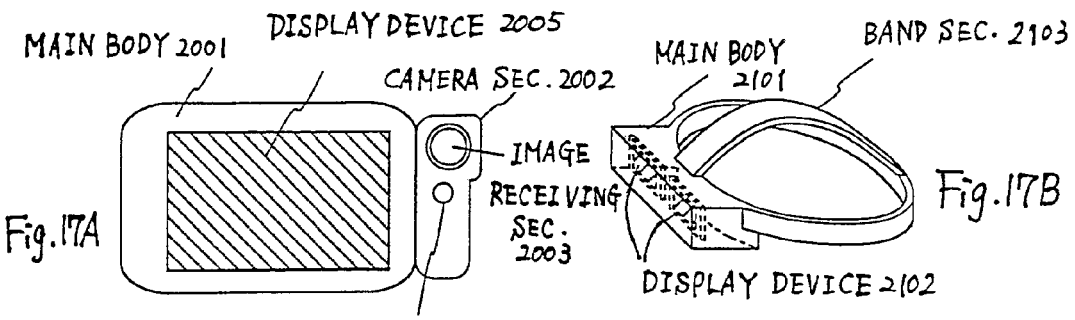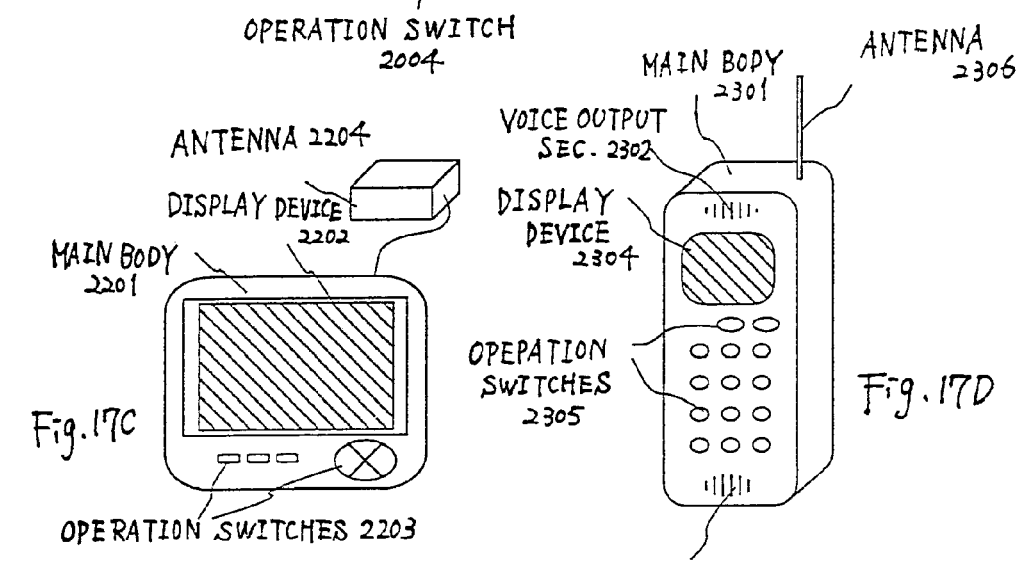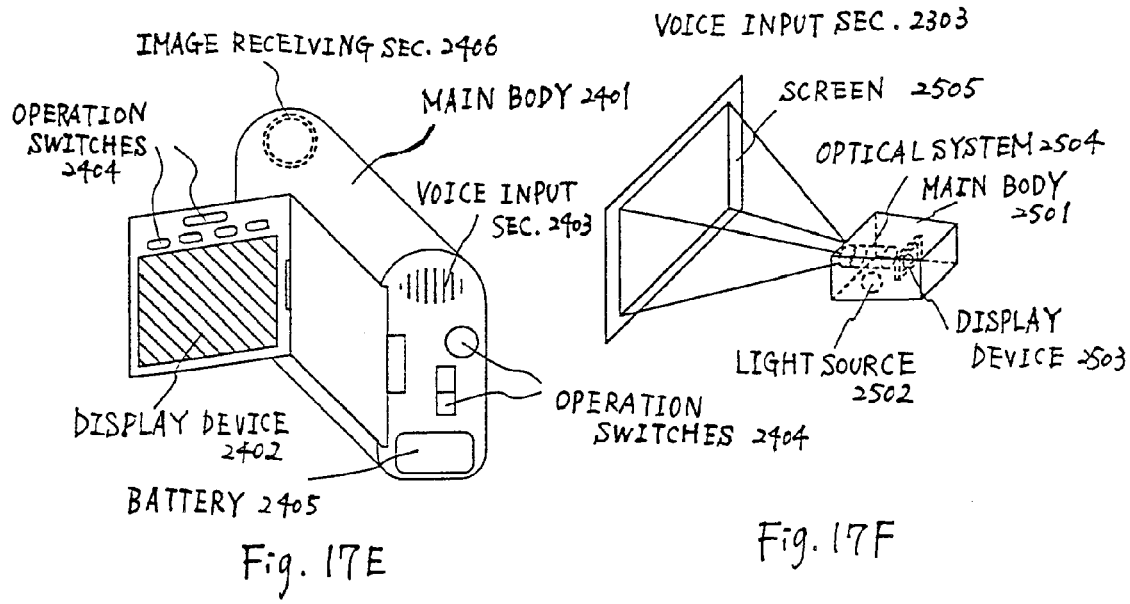

SEMICONDUCTOR THIN FILM AND METHOD OF MANUFACTURING THE SAME AND SEMICONDUCTOR DEVICE AND METHOD OF MANUFACTURING THE SAME

This application is a CON of Ser. No. 10/843,613 May 12, 2004 U.S. Pat. No. 7,172,929 and is a DIV of Ser. No. 08/805,952 Feb. 24, 1997 U.S. Pat. No. 6,787,806

BACKGROUND OF THE INVENTION

1. Field of the Invention

The present invention relates generally to semiconductor devices, and more particularly to semiconductor devices having a semiconductor thin film as its active layer and the manufacturing method thereof. The invention also relates to thin film semiconductor transistors with an active layer made of crystalline silicon films.

2. Description of the Prior Art

In the recent years semiconductor thin-film transistor (TFT) devices are becoming more widely used in the manufacture of electronic parts or components, particularly reduced-thickness display devices and digital integrated circuit (IC) packages, as the speed and cost advantages of these devices increase. As such electronics require higher packing density, higher speed, and lower power dissipation, TFTs become more critical in performance and reliability. Some prior known TFTs come with a silicon thin film formed on a substrate with a dielectric surface, which film typically measures several tens to several hundreds nanometers (nm) in thickness.

Typically, the TFT has an active region as defined between spaced-apart source and drain regions for selective formation of a channel region therein. The active region, namely, the channel formation region, as well as its associated source/drain junction regions may play an important role to determine the performance of TFT as a whole. This can be said because the resistance of a current path from the source to drain through the channel, or the mobility of minority charge carriers, can strictly reflect the overall electrical characteristics of TFTs.

Conventionally, amorphous silicon films have been generally employed as the semiconductor thin film constituting the active layer of TFTs. These amorphous silicon films may be fabricated by plasma chemical vapor deposition (CVD) and low pressure thermal CVD techniques.

Unfortunately, the use of such amorphous films is encountered with a problem that where TFTs are required to exhibit higher operation speeds, amorphous films are incapable of trace such trend due to its inherently lowered mobility of charge carriers. To this end, silicon thin films with enhanced crystallinity (to be referred to as the "crystalline silicon film" hereinafter) should be required.

One prior known approach to form such crystalline silicon film on a substrate has been disclosed, for example, in Published Unexamined Japanese Patent Application (PUJPA) No. 6-232059 to be assigned to the present assignee. In this prior art a chosen metallic element is employed to facilitate or accelerate crystal growth of silicon, which is subject to thermal or heat treatment at a temperature of 550° C. for four hours. With this, resultant crystalline silicon film offers enhanced crystallinity. A similar approach has also been disclosed in PUJPA No. 6-244103.

Another prior art approach has been disclosed in PUJPA No. 7-321339, wherein a similar technique is used causing silicon to grow in substantially parallel to the crystal plane of a carrier body, such as a supporting base plate, i.e., substrate. The resulting crystallized region is called the "lateral growth region" in some cases.

The lateral growth region thus formed using the above technique is improved in crystallinity due to the fact that columnar or capillary crystals are gathered with the crystal growth directions being well aligned to one another. The use of such region to form an active layer or layers may contribute to an increase in performance of TFTS.

As the semiconductor manufacturers are commercially demanded to further improve the TFT speed endlessly, even the TFTs with such lateral-growth films as the active layer thereof will be unable to catch up the strict demands due to their inherent limitations as to improvements of the crystallinity.

Advanced active-matrix liquid crystal display (LCD) devices or passive LCDs which employ thin-film transistors (TFTs) for respective picture elements or pixels are examples. The LCDs of these types incorporate peripheral circuitry which includes driver circuits for electrically driving an associative LCD pixel array, image data processor/controllers for handling video signals in a desired format, a memory array for storage of several kinds of information items, and the like. Of those circuit components, the data processor/controllers and memory array are strictly required to be equivalent in performance to presently available advanced integrated circuit (IC) chips as fabricated using single-crystalline wafers. Accordingly, where these LCD driver circuits are integrated on a substrate by use of a semiconductor thin film as formed on the substrate surface, it is required that such thin film exhibit the maximum similarity in nature to the crystallinity of single crystals. Unfortunately, none of the prior art proposed are capable of overcoming this problem. One reason for this is that the lateral growth silicon films do not come without accompanying a problem that reliability and productivity remain lowered due to the fact that the metallic element as used for acceleration of crystal growth might continue to reside within resultant silicon films, which disadvantageously serves to degrade the reproducibility. This is a serious bar to a further advance in semiconductor fabrication technology.

SUMMARY OF THE INVENTION

It is therefore an object of the present invention to provide a new and improved approach that avoids the problems faced with the prior art.

It is another object of the invention to provide a new and improved semiconductor device capable of avoiding the problems faced with the prior art as well as the method for forming the same.

It is a still another object of the invention to provide a semiconductor integrated circuit device capable of offering enhanced performance and reliability without having to make use of single-crystalline semiconductor wafers.

It is yet another object of the invention to form a mono-domain region having superior crystallinity equivalent to single-crystalline on a carrier body with a dielectric surface.

It is a further object of the invention to provide a semiconductor device having an active layer overlying a substrate with a dielectric surface and being made of a mono-domain region that is equivalent in crystallinity to single-crystalline materials.

To attain the foregoing objects, in accordance with one aspect of the present invention, a specific device is provided which has a carrier body with a semiconductor thin film being formed on an insulating surface of the carrier body, featured in that the thin film includes a mono-domain region including a mixture of a plurality of crystals substantially parallel to the carrier body, wherein the crystals may be columnar crystals and/or capillary crystals.

In accordance with another aspect of the instant invention, there is provided a semiconductor thin film on a dielectric surface of a carrier body. The thin film includes a mono-domain region containing a mixture of a plurality of crystals substantially parallel to the carrier body. The crystals may be columnar crystals and/or capillary crystals. Very importantly, the mono-domain region does not include any crystal grain boundary therein. Part of the thin film constituting the mono-domain region contains hydrogen and halogen elements at a carefully chosen rate that is equal to or less than five (5) atomic percent. Preferably, the halogen may be chlorine, bromine and/or fluorine.

In accordance with still another aspect of the invention, the semiconductor device makes use of the mono-domain region exclusively for formation of the active layer thereof. In this case, no grain boundaries are present within the mono-domain region.

In accordance with yet another aspect of the invention, a method of forming a semiconductor thin film is provided, which method including the steps of forming by low pressure chemical deposition an amorphous silicon film on a carrier body having a dielectric surface, selectively forming a silicon oxide film on the amorphous silicon film, retaining a metallic element for facilitation of crystallization of the amorphous silicon film, altering by a first heat treatment at least part of the amorphous silicon film to a crystalline silicon film, removing the silicon oxide film, performing a second heat treatment in a chosen atmosphere containing halogen elements to form a thermal oxide film containing therein halogen on the amorphous silicon film and/or the crystalline silicon film while allowing the crystalline silicon film to change in nature to a corresponding mono-domain region, and removing the thermal oxide film. The resultant mono-domain region is then employed for formation of an active layer of the semiconductor device.

It should be noted here that the term "mono-domain region" is used herein to refer to lateral growth crystal region as formed using the semiconductor thin film manufacturing method of the invention, by taking account of the fact that this region has superior crystallinity enhanced sufficiently to be regarded as the single crystal materials in substance. A principal feature of the mono-domain region is that no grain boundaries are found within its entire region, and accordingly any lattice defects or dislocations are suppressed or eliminated which are otherwise occurred due to presence of transitions and stacking fault (interlayer defects). Another feature is that the mono-domain region avoids inclusion of any metallic elements otherwise acting to badly influence the fundamental characteristics of the semiconductor device.

It should also be noted that the absence of crystal grain boundaries also covers in meaning the fact that even if a few grain boundaries are present, these remain electrically inactive. As such electrical inactive grain boundaries, there have been reported the {111} twin-crystal grain boundary, {111} stacking fault, {221} twin-crystal grain boundary, and {221} twist twin-crystal grain boundary (R. Simokawa and Y. Hayashi, Jpn. J. Appl. Phys., 27 (1987) at pp. 751 to 758).

The present inventors consider that crystal grain boundaries contained in the mono-domain region remain as electrically inactive grain boundaries at increased possibility. In other words, even where some boundaries might be observed therein, such are electrically inactive regions which will no longer affect the movement of charge carriers therein: In this sense, these boundaries if any remain electrically "transparent" to the flow of internal current.

These and other objects, features and advantages of the invention will be apparent from the following more particular description of preferred embodiments of the invention, as illustrated in the accompanying drawings.

BRIEF DESCRIPTION OF THE DRAWINGS

FIGS. 1A to 1C are diagrammatic representations each for explanation of lateral crystal growth regions in a semiconductor device in accordance with the principles of the present invention.

FIG. 15 is a table demonstrating the composition of an artificial quartz target.

FIGS. 17A to 17F show several exemplary electronic devices to which the semiconductor device of the invention is preferably be applicable.

DETAILED DESCRIPTION OF THE INVENTION

Figure 2A:
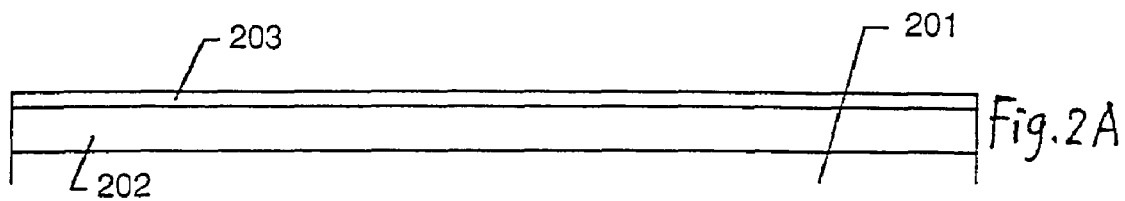
FIGS. 2A through 2F illustrate, in schematic cross-section, some of the major steps in the formation of a semiconductor thin-film with a mono-domain region in accordance with one preferred embodiment of the invention.

Before presentation of some illustrative embodiments of the present invention, the principal concept of fabrication of a "mono-domain" region which is a key to the invention will first be described with reference to FIGS. 1A to 1C, for purposes of convenience of understanding the gist of the invention.

See FIG. 1A. This is a diagrammatic depiction (not drawn to scale) of a plan view of a semiconductor thin film grown on a substrate surface. This thin film is made of a chosen semiconductor material, here, silicon. As shown, a chosen metallic element-doped region 101 is selectively formed on the substrate surface. With this region 101 being as a crystal seed, columnar or capillary crystals 102 are laterally grown in the direction essentially parallel to the crystal plane of the substrate surface.

The metallic element may act to facilitate or accelerate crystal growth or crystallization. The element may be iron (Fe), cobalt (Co), nickel (Ni), ruthenium (Ru), rhodium (Rh), palladium (Pd), osmium (Os), iridium (Ir), platinum (Pt), copper (Cu) or gold (Au), or any possible combinations thereof. Here, Ni was chosen by way of example.

The laterally grown regions 102 formed around the Ni-doped region 101 at a temperature of 600° C. for 6 hours measure approximately 100 to 200 micrometers (μm) in lateral growth width X.

As shown in FIG. 1A, resultant lateral growth region 102 is divided into eight subregions A to H. Each of these subregions may be observed as an independent crystal grain. This can happen because crystal defects and deformations such as transitional slips take place at the boundary whereat adjacent ones of subregions A-H are in conflict with each other, causing crystal grain boundaries to appear.

See FIG. 1B, which is an enlarged depiction of part of the lateral grown grains A-H. Microscopically, the individual lateral grown region 102 is comprised of a mixture or assembly of a plurality of columnar or capillary crystals. A respective one of the columnar and/or capillary crystals is a mono-domain region which essentially avoids inclusion of any grain boundaries therein and therefore can be regarded as a single-crystalline material. Macroscopically, due to the "crowd" of such crystals, resultant assembly may be observed as if it were a single crystal grain as shown in FIG. 1A.

It should be noted that since the individual crystal grows while excluding doped impurity elements such as Ni from the inside thereof, metallic silicide arises on the crystal surface. For this reason, several segregations of metallic elements appear at the grain boundaries as indicated by the numeral 103 in FIG. 1B. This tells that the structure of FIG. 1B is a mere assembly of multiple mono-domain regions, which does not yet cause the individual lateral crystal growth region 102 per se to become such mono-domain region at least at this stage although it exhibits excellent crystallinity.

To attain the inventive contribution, it is inevitable to perform thermal or heat treatment in a chosen atmosphere. Specifically, the lateral growth regions 102 are heated in the atmosphere containing halogen at temperatures of from 700 to 1100° C.; preferably, 800 to 1000° C.; more preferably 950° C. with such heat treatment, the metallic element contained in the lateral crystal growth regions 102 is removed away by getter action of halogen. When this is done, silicon atoms which have been tightly coupled with the metallic element are broken and decoupled apart therefrom with the result in formation of a number of unpaired coupling hands (dangling bonds). Some silicon atoms are then recombined with adjacent silicon atoms. The recombined junction planes obtained after heat treatment are indicated by dotted lines 104 in FIG. 1C. In the state of FIG. 1C, columnar or capillary crystals in the lateral growth subregions A-H are recombined together while exhibiting excellent lattice matching, attaining an extreme reduction or absence of crystal grain boundaries therein.

The heat treatment after lateral crystal growth is designed to be done at relatively high temperatures around 950° C. The setting of such high temperature may serve to eliminate or minimize occurrence of possible dislocations and/or stacking fault (interlayer defects) while allowing dangling bonds which still remain after the heat treatment to be terminated with those of hydrogen or halogen atoms as contained in resultant crystal growth film. As a result of this, the individual one of subregions A-H contains therein none of crystal boundaries and impurity atoms such as Ni while avoiding almost completely inclusion or presence of crystal defects or dislocations. This results in a mono-domain region being much improved in crystallinity.

A significant feature of the mono-domain region shown in FIG. 1C is that hydrogen and halogen elements are contained in the film at 5 atomic percent (at %) or less. This is originated from the fact that hydrogen or halogen atoms attempt to fill the dangling bonds of silicon atoms.

A manufacturing method of a semiconductor thin film of such "pseudo single-crystalline" mono-domain region in accordance with one preferred embodiment of the invention will be fully described with reference to FIGS. 2A to 2F. This embodiment assumes fabrication of a crystalline silicon thin film on a substrate having a dielectric surface. The embodiment also assumes use of specific arrangement for further enhancing the crystallinity of a lateral crystal growth region made of such crystalline silicon for achievement of an increase in crystallinity of the mono-domain region. Note here that the crystallization technique as employed here is to selectively dope a chosen metallic element—nickel (Ni) atoms or ions, here—which acts to facilitate or accelerate crystal growth of amorphous silicon, thereby allowing crystal growth to progress in the direction substantially parallel to the substrate surface for formation of a crystalline silicon thin film. The technique per se has been fully described in PUJPA No. 7-321339, which is now incorporated herein by reference.

In FIG. 2A a substrate 201 with a dielectric surface is first prepared. The substrate 201 may be made of silicon on which a silicon oxide film 202 is deposited as a primary coat layer to a predetermined thickness, for example, 3000 angstroms (Å), i.e., 300 nanometers (nm). The silicon oxide coat film 202 may be deposited by sputtering techniques using an artificial quartz target (for reference, its component ratio is presented in FIG. 15). The use of such specific sputtering techniques using the artificial quartz target is recommendable for fabrication of silicon oxide coat film 202 because a sputtered film is more dense in crystal structure, which may in turn lead to accomplishment of improved crystallinity of a crystalline silicon film to be later formed thereon, as taught by experimental results made by the present inventors.

The silicon oxide coat film 202 is flat on its top surface providing smooth crystal plane. Our experimentation revealed the fact that possible surface configuration of film 202 is as small as 3 nm or less in height and 10 nm or less in width. This ensures that any possible surface irregularity if any is hardly observable even by use of atomic fluorescence microscopy (AFM).

An amorphous silicon film 203 is then deposited on the silicon oxide coat film 202 by plasma chemical vapor deposition (CVD), sputtering or low pressure CVD techniques to a predefined thickness of 10 to 75 nm, preferably 15 to 45 nm. When low pressure CVD techniques are employed, the film formation gas used therefor may be disilane ($Si_2H_6$), trisilane ($Si_3H_8$), or the like. The thickness of amorphous silicon film 203 should be carefully controlled to fall within the above recommended range. This is based on the fact that such thickness settings may permit manufacture of required semiconductor devices such as thin-film transistors (TFTs) low in turn-off current in cases where resultant crystalline silicon film to be fully discussed later in this description is employed as the active layer of each TFT. Note that the amorphous film 203 as formed using low pressure CVD techniques remains low in ratio of natural nuclear appearance during later steps of manufacture for crystallization of the same. This advantageously serves to allow lateral crystal growth to increase in width due to a reduction in rate of mutual interference (termination of crystal growth upon occurrence of crash or collision) between adjacent individual crystals.

After deposition of the amorphous silicon film 203 overlying the silicon oxide coat layer 202, the structure of FIG. 2A is then exposed to ultraviolet (UV) rays, forming an extremely thin oxide film (not shown) in the exposed surface of film 203. This oxide film is for improvement of the wetness of solutions as employed during the solution coating process when doping or injection of nickel (Ni) atoms or ions thereinto.

Figure 2B:
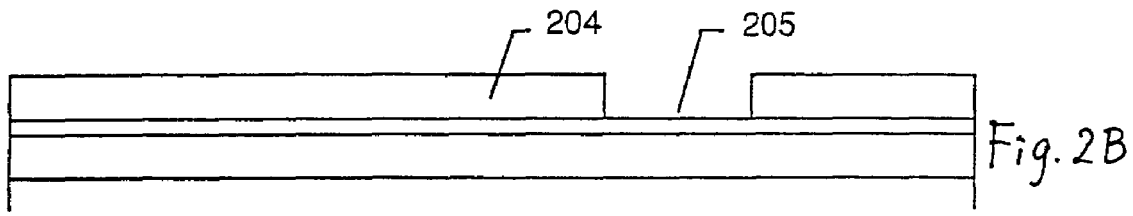

Then, as shown in FIG. 2B, an oxide silicon film 204 is deposited to a thickness of 50 to 120 nm, on the structure of FIG. 2A, using sputtering techniques with a chosen quartz as a target. Selected parts of the resulting film 204 are then removed away by etching, thereby forming a patterned layer. This patterned layer will function as a mask to be used for selective doping of an "impurity" such as Ni into the underlying amorphous silicon film 203. As can be seen from FIG. 2B, film 203 is partially exposed to the atmosphere in surface area 205 through a corresponding opening of patterned mask layer 204. The exposed surface area 205 has a planar shape that resembles a slit which elongates in a direction normal to the paper surface of the illustration of FIG. 2B.

Figure 2C:
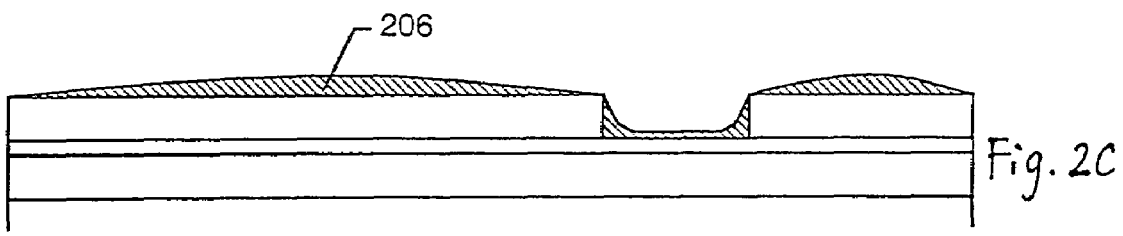

Next, as shown in FIG. 2C, the structure of FIG. 2B is placed on a known support table (not shown), provided with a few of drops of coating solution, and then rotated with circular rotational speed sufficient to centrifugally spin the coating solution uniformly and radially across the upper surfaces of the mask 204 and film 205. A coat solution 206 is thus deposited covering the upper surface of the structure as shown. Part of the solution 206 allows Ni to be held above the exposed surface area 205 of film 203 with the extremely thin oxide film (not shown) being laid therebetween. The solution is nickel acetate. Note however that nickel nitrate may be preferable for the coating solution in view of the possibility that the impurity tends to continue residing during one or several heat treatments to be discussed later. This can be said because nickel acetate solutions inherently contain carbon (C) therein, which might badly behave to carbonize part of a heated film causing undesirable residual impurity to remain continuously therein.

The structure of FIG. 2C is put in the inactive gas-filled atmosphere, and heated at a temperature of 450° C. for one hour for removal of hydrogen contained therein. The resulting structure is further heated at a predetermined temperature—for example, 500 to 700° C.; preferably, 550 to 600° C.—for 4 to 8 hours. This heating treatment is for crystallization of the amorphous silicon film 203, and will be referred to as the "first heat treatment" hereinafter. As a result, a crystalline silicon film 207 is obtained on the substrate 201.

During the first heat treatment, in area 205, nickel is diffused from load 206 through the thin oxide (now shown) into the underlying amorphous silicon film 203, and acts as a catalyzer for acceleration of crystal growth or crystallization. More specifically, nickel and silicon are allowed to chemically react together to form silicide, which then acts as a source of growth or "seed" for later crystallization.

During the crystallization, columnar and/or capillary crystals are grown in the direction substantially parallel to the top surface of the substrate. In this embodiment since the exposed slit-like surface area 205 extends in the direction perpendicular to the paper of illustration as discussed previously, the crystal growth attempts to progress essentially in a specific direction as denoted by numeral 208 in FIG. 2D. At this time the crystal growth was demonstrated to span several hundreds µm or greater.

At this stage, natural nucleus generation can happen due to execution of the heat treatment. If this is the case, resultant columnar or capillary crystals interfere with each other mutually disturbing crystal growth. This may result in a decrease in width in the lateral growth region. To suppress or eliminate this, it is preferable that specific conditions be set for causing the introduced nickel atoms to exclusively serve as the speed of crystal growth. The concentration of nickel is readily controllable by adjusting that of nickel-based solution during the solution coating process.

Figure 2D:
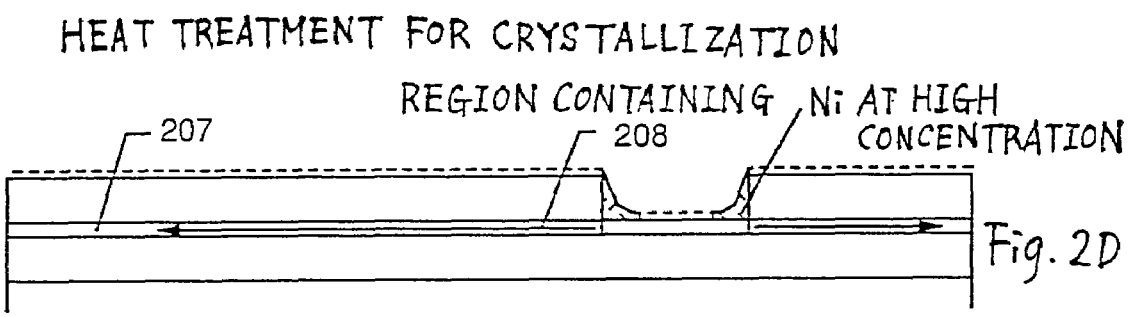

The lateral crystal growth in the step of FIG. 2D is free from any influence or affection by other neighboring crystals due to the fact that the lateral crystals grown are identical in direction of growth. For this reason, the lateral grown crystals can be observed as a single enlarged crystal grain as a whole which measures several hundreds micrometers (µm) or greater. Microscopically, however, the resulting structure is a mere mixture or assembly of multiple columnar and/or capillary crystals at high density. While the individual one of them exhibits a mono-domain in nature, the entire crystal structure formed is a mere region with a relatively good crystallinity as a whole. This means that the crystalline silicon film 207 is incapable of being regarded as a mono-domain region at least at this step of FIG. 2D.

Figure 2E:
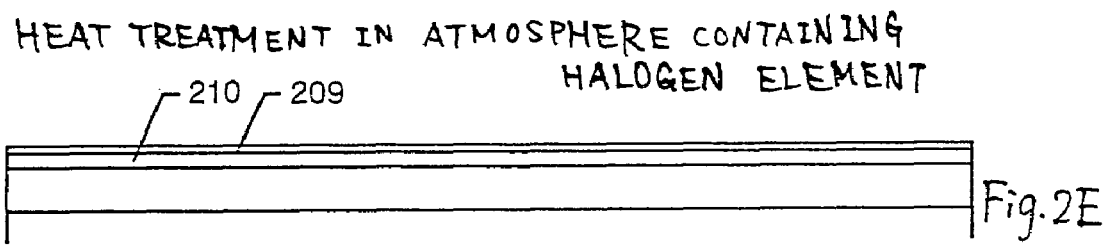

After completion of the first heat treatment, the mask layer 204 is then removed away as shown in FIG. 2E. The removal of mask 204 may be carried out using buffered hydrofluoric acid. The resulting structure is next subjected to a further heat treatment (second heat process) so that the exposed crystalline silicon film 207 is heated at high temperatures which may range from 700 to 1100° C. for 1 to 24 hours. Preferably, the film 207 is heated at 800 to 1000° C. for 6 to 12 hours. The atmosphere used here is designed to contain therein halogen elements. In this embodiment, the second heat treatment was performed at a temperature of 950° C. for 6 hours in a chosen atmosphere of oxygen gas that contains therein HCl at concentration ratio (volume density) of 3%. Note here that further inclusion of nitride gas may be recommendable for achievement of sufficient getter effects since it acts to slow the rate of formation of any oxide films. Note also that while Cl was chosen as the halogen element in this embodiment with HCl gas being employed as introduction material thereof, other kinds of gases may alternatively be used. HF, $NF_3$, HBr, $Cl_2$, $F_2$ and/or $Br_2$ are examples. Halogen hydrides or organic substances (carbohydrides) are other possible examples.

During the second heat process step of FIG. 2E, the nickel in the crystalline silicon film 207 heated is gettered due to the chlorine's action, and thus is removed away as a result of absorption into an overlying thermal oxide film 209 and/or release toward the atmospheric air. Accordingly, almost all Ni elements contained are removed from film 207 providing a Ni-absent crystalline silicon film 210 covered by the thermal oxide film 209 as shown in FIG. 2E.

The nickel removed during the getter step of FIG. 2E has been segregated as a result of push-out toward the crystal boundaries (see 103 in FIG. 1B) during crystallization. It can thus be considered that Ni has existed as nickel silicide at the crystal boundaries. The nickel is separated apart therefrom as nickel chloride resulting in presence of a number of dangling bonds of silicon after cutoff from nickel atoms at grain boundaries therein. Fortunately, several dangling bonds of silicon atoms are forced during the second heat treatment at 950° C. to mutually recombine those of the remaining ones. Dangling bonds, if any, are filled with those of hydrogen and halogen atoms as also contained in the crystalline silicon film 210. This ensures that the boundaries are in junction with one another with an enhanced matching property due to such recombination of silicon atoms, enabling the lateral crystal growth region of film 210 per se to become an intended mono-domain region. Furthermore, as a result of the second heat treatment, crystal defects such as the transitions, dislocations or stacking fault inside the columnar and capillary crystals will disappear almost completely enhancing the crystallinity of them.

Our experimentation using secondary ion mass spectrometer (SIMS) analysis revealed the fact that after completion of the second heat treatment process of FIG. 2E, the crystalline silicon film 210 was reduced in Ni concentration by one to three orders of magnitude.

Figure 2F:
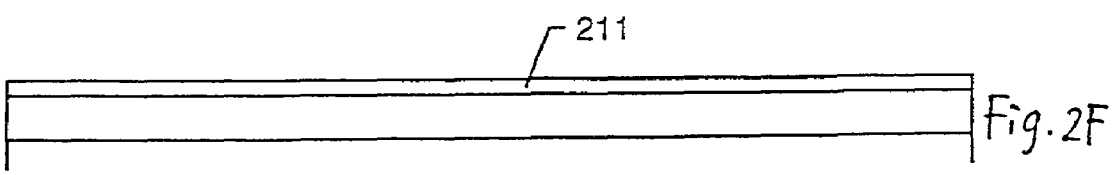

After completion of the Ni-getter process, the overlying "getter-cite" thermal oxide film 209 of FIG. 2E is removed away by known techniques, thereby preventing gettered nickel atoms or ions from attempting to diffuse back or "rediffuse" into the crystalline silicon film 210 of FIG. 2E. Finally a structure of FIG. 2F is obtained which has at its top surface a crystalline silicon film 211 with the Ni concentration minimized. This film 211 has a "pseudo single-crystalline" region in which the grown crystals extend in the direction principally parallel to the substrate surface as designated by numeral 208 in FIG. 2D.

Very importantly, in this region of film 211 of FIG. 2F, Ni has been removed or decreased, by execution of the heat treatment in the halogen atmosphere, down at a required concentration that is low sufficient to ensure that any resultant residual Ni atoms or ions no longer disturb the manufacture or fabrication of intended semiconductor devices including TFTs—for example, $1\times10^{18}$ atoms per cubic centimeter (atoms/cm$^3$), preferably $1\times10^{17}$ atoms/cm$^3$ or less. This in turn leads to an increase in crystallinity to the extent that resulting film 211 exhibits a mono-domain region which is maximized in crystallinity and can be equivalent in crystal structure to single-crystalline materials.

Another significant feature of the pseudo single-crystalline silicon film 211 is that the mono-domain region is much decreased in surface configuration to ensure that any possible variations in height of surface configuration measure plus or minus 3 nm (±2 nm, for better values as demonstrated by our experimentation). It can be considered that such well-limited surface configuration was shown as originated from the fact that the oxide silicon mask layer 204 advantageously serves to hold under adequate pressure the exposed surface of the underlying crystalline silicon film during the crystal growth thereof. This may suggest the possibility of employing the mono-domain region as an intended active layer that is maximized in flatness of its top surface.

A manufacturing method of a TFT structure in accordance with the principles of the instant invention is shown in FIGS. 3A to 3E. This method makes use of the structure of FIG. 2F having the pseudo single-crystalline silicon film 211 with mono-domain region. While the illustrative embodiment will be described herein in connection with a top-gate TFT structure, the invention should not exclusively be limited thereto. One skilled in the art will readily recognize that the method of FIGS. 3A to 3E may alternatively be applicable to formation or fabrication of a bottom-gate TFT with the gate electrode being replaced by the one which is made of a chosen material high in heat resistance.

Figure 3A:
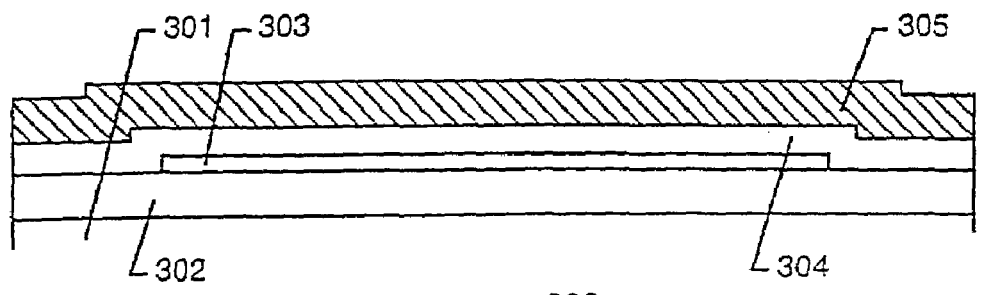
FIGS. 3A to 3E illustrate, in schematic cross-section, some of the major steps in the fabrication of a semiconductor device of the invention.

As shown in FIG. 3A, a silicon substrate 301 comes with a silicon oxide film 302 and a pseudo single-crystalline silicon film 303 being laminated on the surface of substrate 301 in this order. These films 302, 303 may be fabricated using the method shown in FIGS. 2A-2F. The silicon film 303 has therein a mono-domain region as mentioned previously. Film 303 is patterned by patterning techniques as shown in FIG. 3A. The patterned film 303 will be later used as an active layer of a TFT structure.

In the structure of FIG. 3A, another silicon oxide film 304 is deposited by plasma CVD techniques to a predetermined thickness, for example, 150 nm. This film 304 will later act as the gate insulation film of TFT. Film 304 may alternatively be made of silicon oxynitride or silicon nitride. An aluminum film 305 is then deposited by sputtering to a thickness of 500 nm on film 304. Film 305 overlies film 304 and will act as the gate electrode of TFT. Film 305 may contain therein an impurity of scandium at 0.2 weight percent (wt %). Film 305 may also be made of other conductive materials, such as tantalum, molybdenum, or others.

The structure of FIG. 3A is then subject to formation of an anode oxide film (not shown) of typically 10-nm thick overlying the aluminum film 305. This formation process employs as electrolytic solution ethylene-glycol solution containing 3% tartaric acid as neutralized using ammonia water. Anode oxidization is carried out in such a way that when the structure is put in the electrolytic solution, film 305 is used as the anode while a platinum layer (not shown) is as cathode therefor. A resultant anode oxide film thus formed at this step is dense enough to improve the contact or adhesion characteristics with a resist mask to be later formed thereon.

Figure 3B:
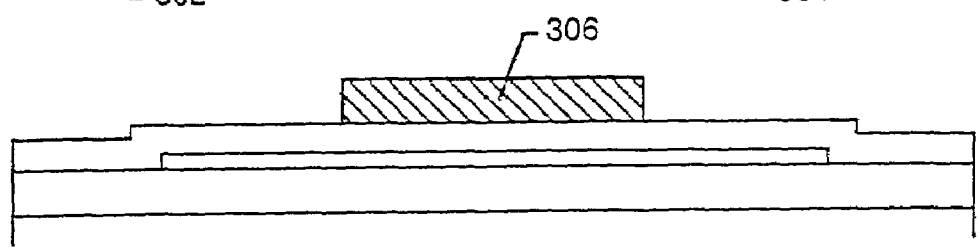

As shown in FIG. 3B the aluminum film 305 is patterned forming an island 306 on silicon oxide film 304. The aluminum island 306 will serve as a base layer of the TFT gate electrode. Although omitted from the depiction of FIG. 3B, a mask layer as used for patterning film 305 of FIG. 3A is not yet removed and continue to reside at this stage.

Figure 3C:
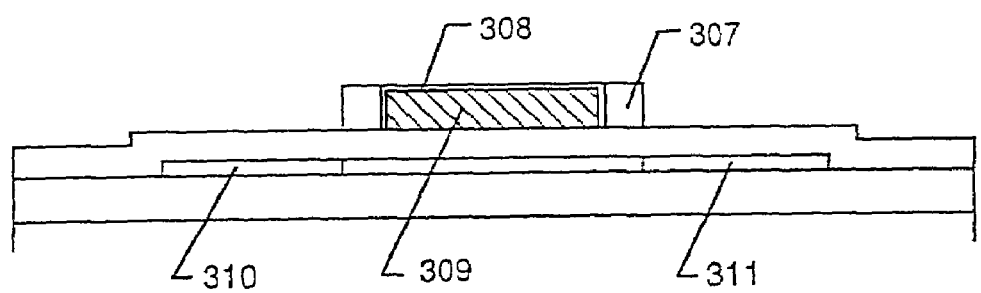

The structure of FIG. 3B is again subjected to the anode oxidation process with island 306 being as the anode therefor. The electrolytic solution here may be aqueous solution of 3%-oxalic acid. At this step the anode oxidization progresses only at the side walls of island 306 due to presence of the aforesaid resist mask (not shown). This results in formation of anode oxide films 307 at opposite island side walls as shown in FIG. 3C. These side wall films 307 are porous in nature and are capable of regularly growing to span an increased distance of several μm. Porous side-wall films 307 measure 700 nm in thickness. The thickness is well controllable by adjustment of the time length of oxidation. After formation of films 307, the resist mask is then removed. Anode oxidation process is again carried out forming a thin, dense anode oxide film 308 covering island 309. This process may be similar in condition to the above-described anode oxidation, except for that film 308 measures 80 nm in thickness. Note at this step that such anode oxide film 308 is formed due to the fact that the electrolytic solution used attempts to enter or soak into porous anode oxide films 307. Increasing the thickness of film 308 up to 150 nm or greater may permit formation of a required offset gate region in a later step of injection of chosen impurity ions thereinto. Such dense film 308 will be able to function at a later step to suppress or eliminate occurrence of hillocks at the surface of a TFT gate electrode (as will be denoted by numeral 309 later).

After formation of the thin dense anode oxide film 308, an impurity of a chosen conductivity type—here, P ion for manufacture of an N-channel TFT (NTFT)—is doped by ion injection into the underlying patterned silicon film 303, thereby forming spaced-part heavily doped regions 310, 311 which will act as the source and drain of a TFT structure when completed.

Figure 3D:
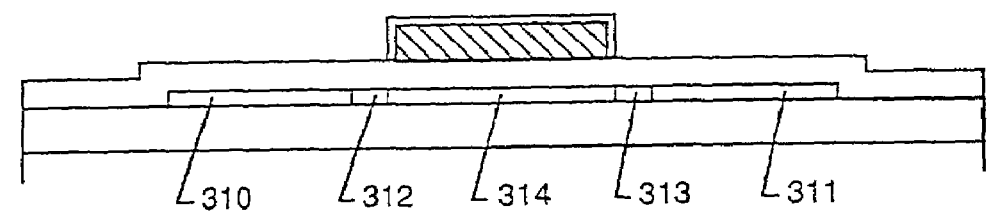

The porous anode oxide films 307 are selectively etched away using a chosen etchant of a mixture of acetic acid, phosphoric acid and nitric acid. Thereafter, P ions are again injected into resultant structure. The charge dose of this ion injection may typically be less than that for formation of the source and drain regions 310, 311 in film 303. Spaced-part lightly-doped regions 312, 313 are thus defined in film 303, which are in contact with the inner edges of heavily-doped source and drain regions 310, 311 as depicted in FIG. 3D, while allowing an intermediate region 314 between regions 312, 313 to be self-aligned with the overlying gate electrode island 309. The intermediate region 314 is as a channel region in the TFT structure.

After impurity injection the structure of FIG. 3D is then subjected to photo-anneal treatment by irradiation of a laser beam, infrared beam or ultraviolet (UV) beam. In this way, the fundamental TFT structure called the "lightly-doped drain (LDD)" structure is obtained which is with the source region 310, lightly-doped regions (LDD regions) 312, 313, channel region 314, and drain region 311.

It is recommendable at this step of fabrication that plasma hydrogenation treatment is performed at temperatures of 300 to 350° C. for 0.5 to 1 hour. This process is for doping hydrogen into the active layer 303 at a predetermined concentration, such as 5 atom % ($1\times10^{21}$ atoms/cm$^3$ or less); preferably, approximately $1\times10^{15}$ to $1\times10^{21}$ atoms/cm$^3$. The doped hydrogen can eliminate dangling bonds of silicon atoms in active film 303 or the level of an interface between the active layer and gate insulation film through neutralization since the doped hydrogen is active.

Figure 3E:
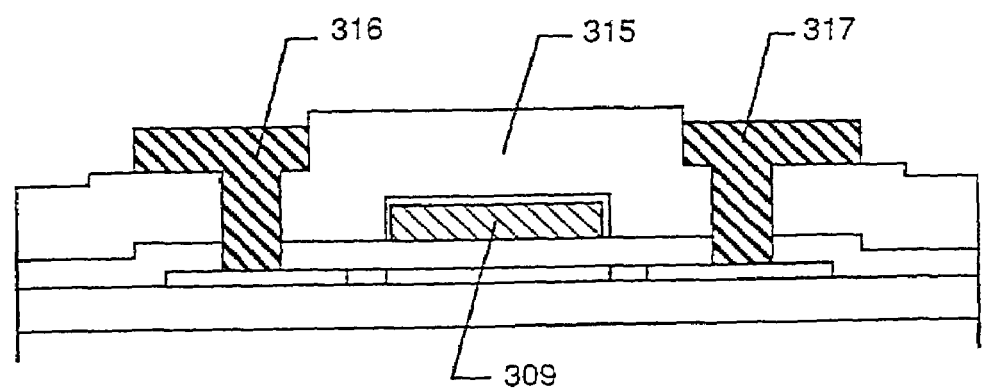

Next, as shown in FIG. 3E, a dielectric film 315 is deposited as an interlayer insulation on the structure of FIG. 3D. Film 315 may be made of silicon oxide, silicon nitride, silicon oxynitride, resin or any possible multi-layered combinations of them. The use of silicon nitride is preferable due to the capability of elimination of re-diffusing out of hydrogen doped at the previous step toward exterior of the device structure. Interlayer insulation film 315 is then patterned defining openings that act as contact holes for wirings. Metallic layers 316, 317 are next deposited to fill these contact holes providing source and drain electrodes of TFT. In cases where this TFT is for use as a picture element or "pixel" transistor in active-matrix liquid crystal display (LCD) panels, there is not required any take-out or pad electrode for supplying electrical signals to the gate electrode 309 of FIG. 3E; on the other hand, where the TFT is for use in peripheral driver circuitry, it will be required that a takeout or pad electrode electrically associated with gate 309 be formed simultaneously. The resultant structure is thereafter subjected to hydrogenation by execution of heat treatment in the atmosphere of hydrogen gas at 350° C. A TFT structure is thus completed as shown in FIG. 3E.

The TFT structure thus fabricated may offer field-effect carrier mobility that is excellent enough to attain high speed switching operations as required. This is due to the fact that its active layer is fully comprised of the mono-domain region. The reliability can also be enhanced since there are no substantive grain boundaries in the channel region as well as at the drain junction while eliminating segregation of nickel compounds therein.

An explanation will now be given of advantages of the thermal oxidation process in the atmosphere containing halogen elements for formation of the mono-domain region 211 of FIG. 2E.

Figure 4:
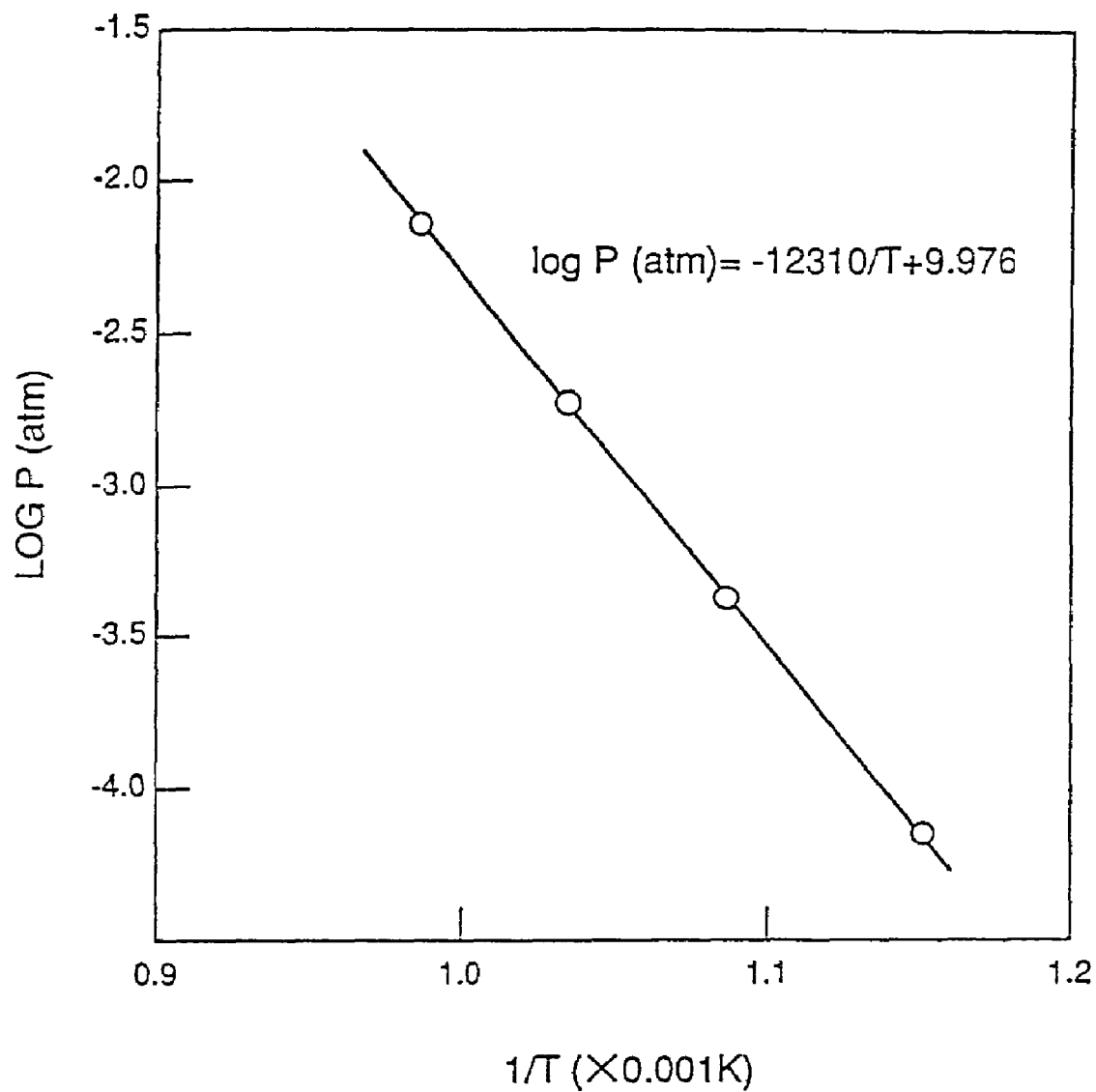
FIG. 4 is a graphic representation showing the relation of the vapor pressure of nickel chloride versus temperature.

See FIG. 4. This graph shows the relation of vapor pressure of nickel chloride ($NiCl_2$) versus temperature. As shown, since $NiCl_2$ is a sublimative material, Ni in the mono-domain crystalline silicon film 210 of FIG. 2E tends to exhibit sublimation in nature as soon as it is gettered by chlorine. Resultant nickel chloride compounds will be released from film 210 by outdiffusing into the air or by being absorbed by its overlying thermal oxide film 209. This advantageously serves to enable successful removal of Ni from film 210.

Electrical characteristics of the TFT structure of FIG. 3E will be described with reference to FIG. 5, which shows the relation of gate current (Vg) versus drain voltage (Id) of the TFT. In this graph two Vg-Id characteristic curves are plotted: one curve 501 is that of the TFT of FIG. 3E in accordance with the invention; the other 502 is of one standard TFT as fabricated without execution of the heat treatment and nitride anneal steps.

Comparing the two transistor characteristics 501, 502 reveals the fact that a turn-on current flowing in the TFT of the present invention is greater by two to four orders of magnitude than that of the standard TFT. The turn-on current refers to a drain current that flows while TFT is rendered conductive upon application of a gate potential of 0 to 5 volts as shown in FIG. 5.

Figure 5:
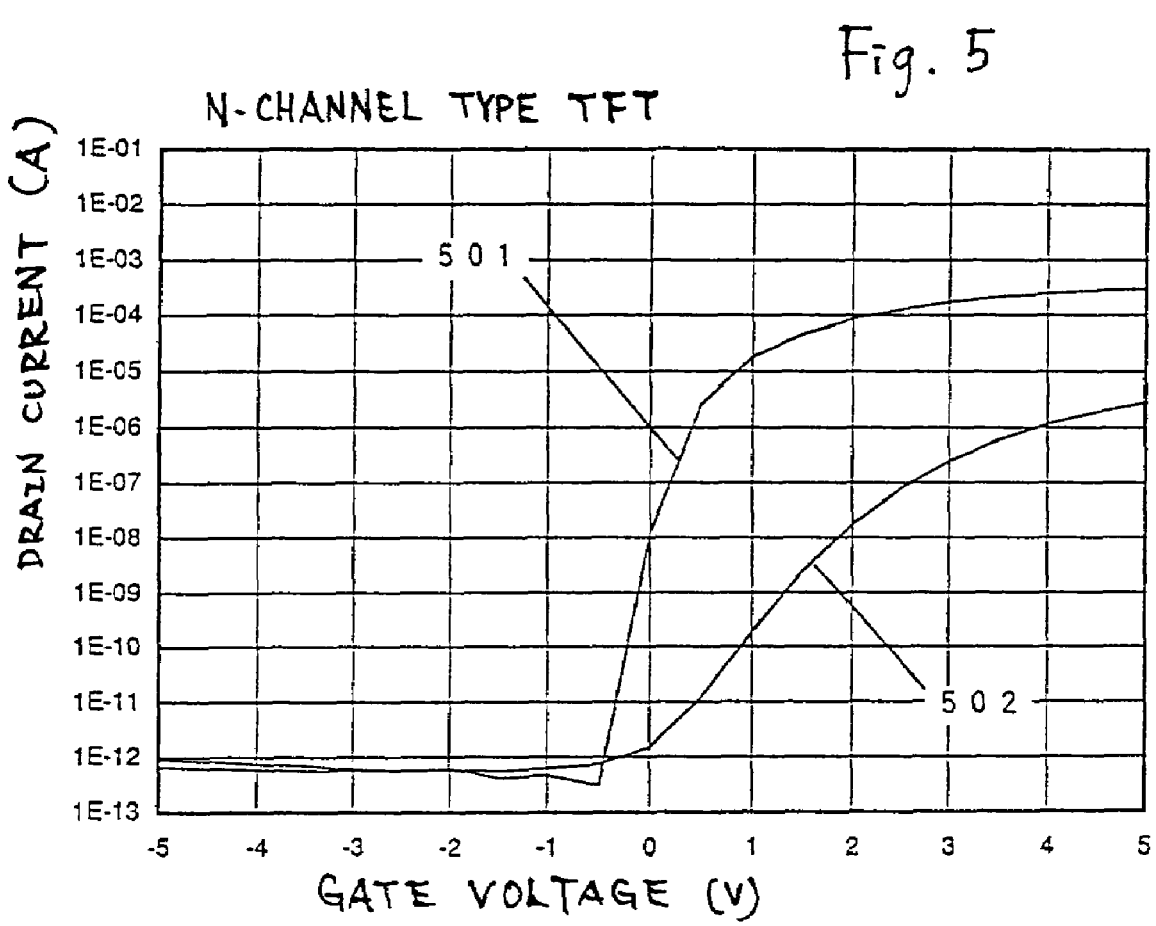
FIG. 5 is a graph showing the electrical characteristics of a thin-film transistor (TFT).

It can be also seen from viewing the graph of FIG. 5 that the TFT of FIG. 3E is greater in sub-threshold characteristic than the standard TFT. The "sub-threshold" characteristic, as used herein, refers to a measure representative of the sharpness of TFT switching operations: As a skilled person readily recognizes, the more sharp the rising angle of Id-Vg curve when TFT switches from the off to the on state, the better the sub-threshold characteristics.

Attention should also be paid to the fact that the sub-threshold characteristic of the standard TFT remains around 350 mV/decade whereas that of the present invention is as low as approximately 100 mV/decade. This tells that the TFT of the present invention is enhanced in switching performance also. With regard to the field-effect carrier mobility which serves as a key parameter for estimation of TFT operation speed, the standard TFT is 80 to 100 cm$^2$/Vs whereas the present invention is as large as 180 to 200 cm$^2$/Vs. This means that the latter can operate at high speeds accordingly. From the foregoing, it can be experimentally seen that the TFT structure of this invention is capable of being much improved in electrical characteristics.

Our experimentation demonstrates a significant advantage of the getter action of metallic element using chlorine as will be set forth below in connection with the TFT structure of FIG. 2E.

Figure 6:
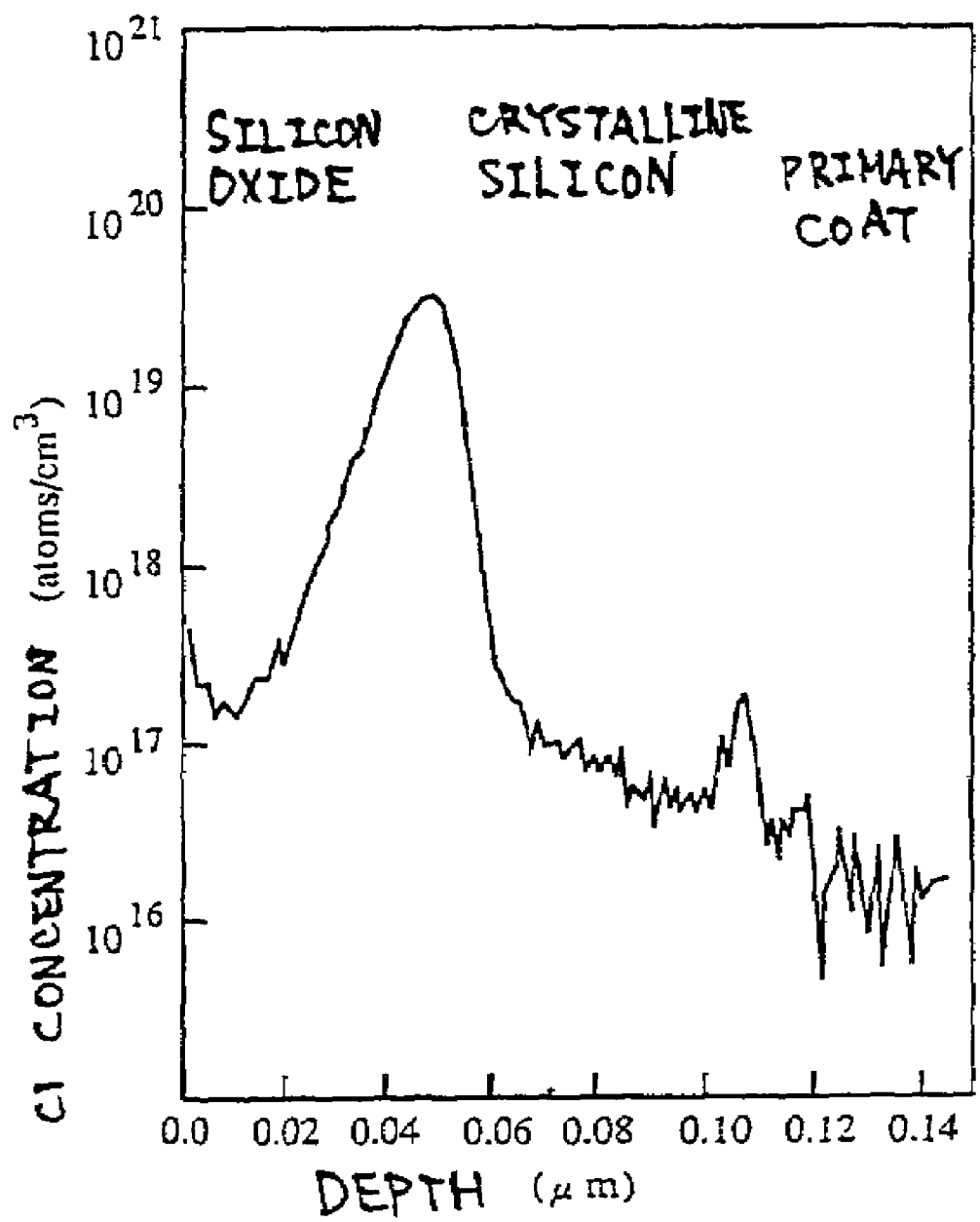
FIG. 6 is a graph showing the distribution of concentration of chlorine as contained in a crystalline silicon film.

See FIG. 6, which is a graphical representation of an experimental result indicative of the concentration distribution of the crystalline silicon film 210 along the profile thereof, as measured using SIMS. Note here that measurement data with respect to certain region near the film surface may be somewhat insignificant due to presence of the risk of affection or influence from possible surface configuration and absorbed residual objects therein. Note also that for the same reason, data near interfaces may possibly involve errors. As can be seen from the graph of FIG. 6, chlorine is much present at or near the interface between crystalline silicon film 210 and its overlying thermal oxide film 209. It is likely that this is because chlorine absorbed in the surface of film 210 at the beginning of the heat treatment outdiffuses into thermal oxide film 209 with Ni gettered. It is also considered that this suggests that a number of unpaired coupling hands called the "dangling bonds" which have been at the surface of film 210 prior to formation of film 209 are filled (terminated) with those of chlorine. Consequently, in cases of manufacturing a semiconductor device, it is expectable that chlorine does exist at the surface of the active layer of the device—more precisely, at or near the interface between active layer and gate insulation layer—with enhanced distribution of concentration.

Figure 7:
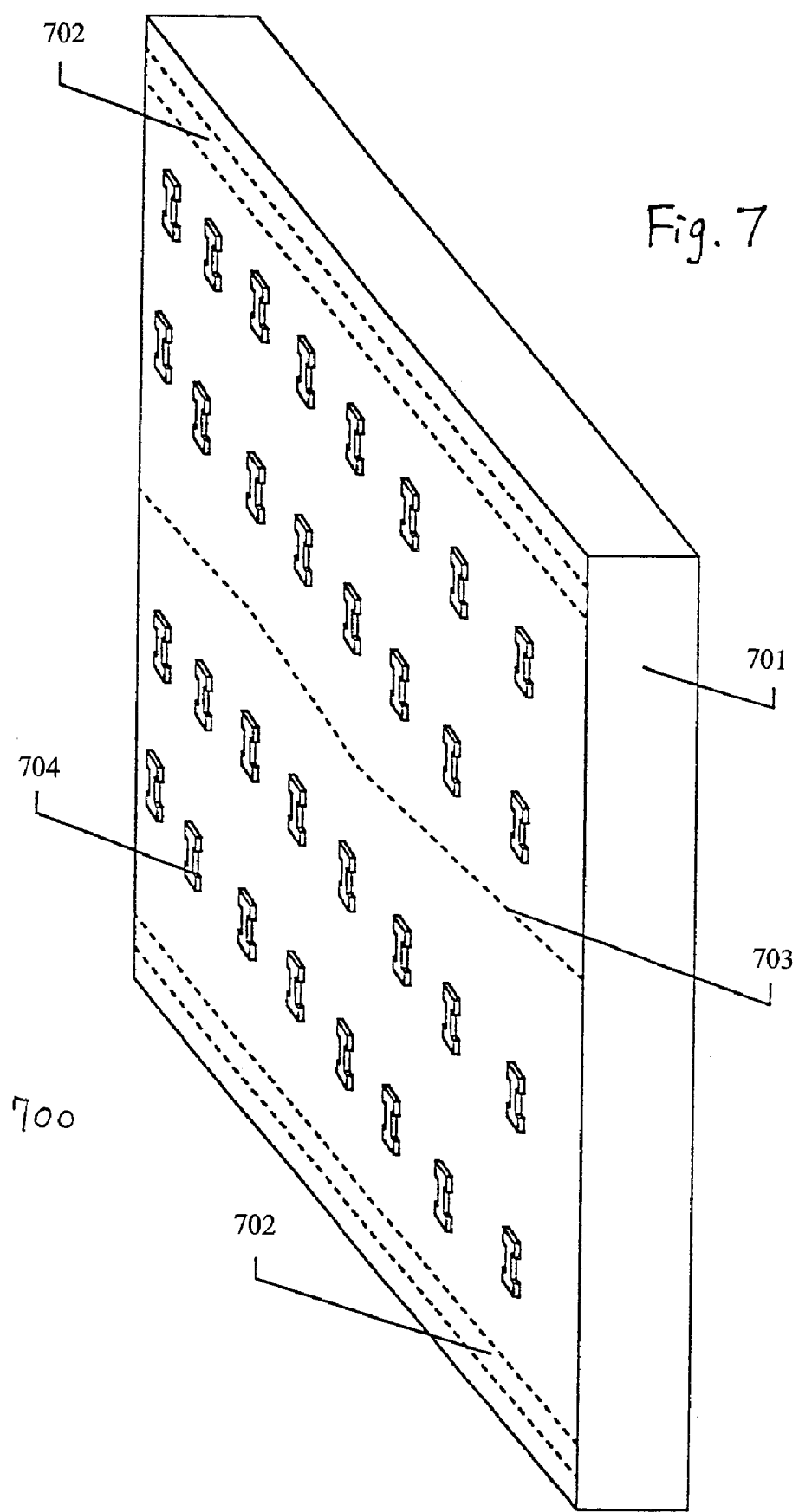
FIG. 7 is a perspective view of a substrate structure for use in active-matrix liquid crystal display (LCD) devices, having an array of active layers as formed in a mono-domain region.

A semiconductor structure 700 is shown in FIG. 7, which is for use in an active-matrix liquid crystal display (LCD) device with thin film transistors each having an active layer consisting of the mono-domain region of the present invention. As shown, the structure 700 includes a substrate 701 having an insulating or dielectric surface on which an array of patterned active layers 704 of thin-film transistors (TFTs) are disposed in rows and columns. Two stripe-shaped elongate surface areas 702 at the opposite side edges of substrate 701 are certain locations where selective Ni-doping zones have been positioned. A broken line 703 is depicted in FIG. 7 to show the locus of a linear crystal grain boundary which has been formed here due to mutual conflict of lateral growth regions in a manner as has been discussed previously in connection with FIGS. 1A-1C. The dotted line is used because such boundary 703 will successfully disappear after completion of fabrication of patterned active layers 704 and become invisible accordingly.

As shown in FIG. 7, the array of active layers 704 are formed on the top surface of substrate 701 while eliminating inclusion of the Ni-doping areas 702 and the locus of boundary 703. This is also true for the remaining ones (not shown) of TFT active layers on the order of 106 in number on substrate 701.

A fabrication method of a complementary metal oxide semiconductor (CMOS) transistor is shown in FIGS. 8A through 8K, which method makes use of the TFT formation process shown in FIGS. 3A-3E though the present invention should not be exclusively limited thereto.

Figure 8A:
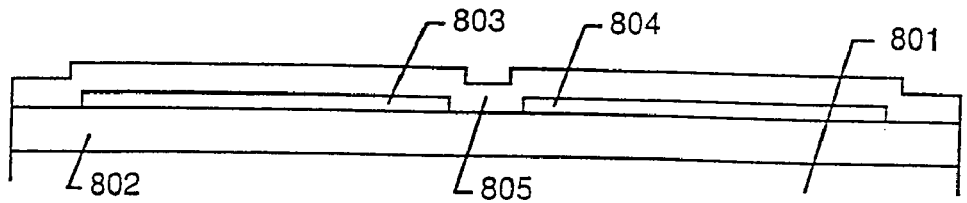
FIGS. 8A to 8K illustrate, in schematic cross-section, some of the major steps in the formation of a semiconductor device in accordance with a further embodiment of the invention.

As shown in FIG. 8A, an insulating substrate 801 is prepared on which a silicon oxynitride film 802 is deposited. Substrate 801 may be made of glass, quartz or the like. Film 802 has a surface on which a mono-domain crystalline silicon film is formed using the technique in a manner similar to that as discussed previously. This silicon film is then patterned to define spaced-apart mono-domain active layers 803, 804: One 803 is for use in an N-channel TFT (NTFT); the other 804 is for a P-channel TFT (PTFT). Only two transistors are depicted here for purposes of explanation only; practically, when the invention is reduced to practice, several millions of P- and N-channel TFTs are formed and integrated by microelectronics fabrication techniques on the same substrate. An overlying gate insulation film 805 is next deposited by plasma CVD techniques to a predetermined thickness, such as 50 to 200 nm, preferably 100 to 150 nm. Film 805 may be made of silicon oxide, silicon oxynitride, silicon nitride, or other available dielectric materials.

Figure 8B:
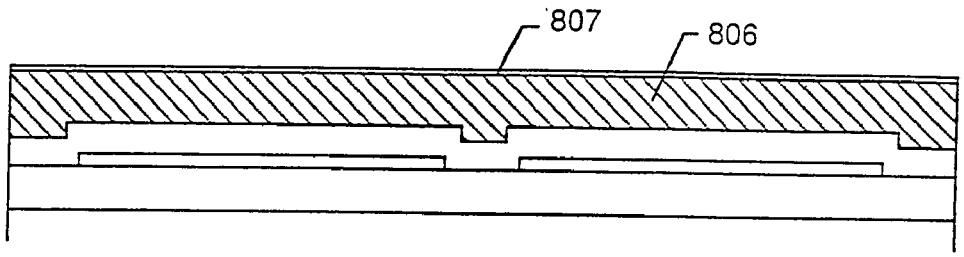

Then, as shown in FIG. 8B, a conductive film 806 is deposited by sputtering or electron-beam deposition over the structure of FIG. 8A. Film 806 may be made of aluminum and will act as gate electrodes of TFTs after patterning at a later step. Film 806 contains therein scandium at 0.2 weight percent (wt %) for elimination of occurrence of hillocks or whiskers. These refer to thorn-like or capillary projections as created due to abnormal crystal growth of aluminum. Presence of such projections will badly behave to cause unwanted short-circuit and crosstalk between adjacent wire leads or between laminated wirings. Film 806 may alternatively be made of anodizable metallic materials, such as tantalum.

At the step of FIG. 8B a thin dense film 807 is formed on the aluminum film 806 by known anode oxidation process in electrolytic solution with film 806 as the anode thereof. The electrolytic solution used here is ammonium-neutralized ethylene glycol solution containing tartaric acid at 3%. The use of such anode oxidation enables formation of a flat, uniform oxide film with enhanced density as well as thickness controllable by application of a voltage. Film 807 here measures 10 nm in thickness, and will act to improve the adhesion characteristics of a resist mask to be later formed thereon.

Figure 8C:
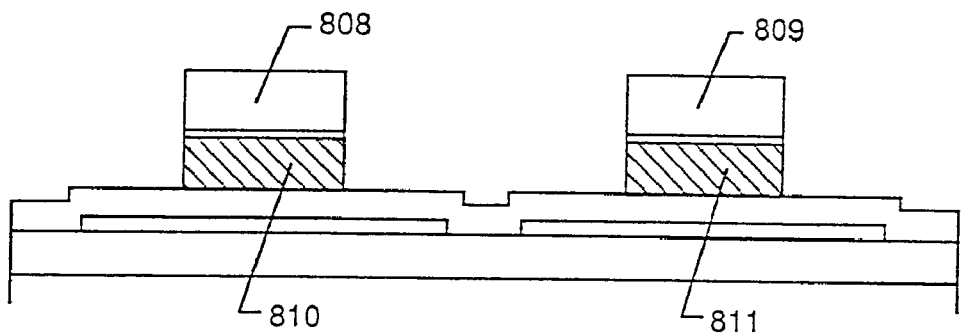
Figure 8D:

Next, as shown in FIG. 8C, a patterned photosensitive resist layer having mask segments 808, 809 is formed on the structure of FIG. 8B. With photoresist masks 808, 809, the underlying aluminum film 806 and anode-oxidation oxide film 807 are subjected to patterning process obtaining a structure of FIG. 8C that has correspondingly patterned film segments 810, 811. This structure is then subject to anode oxidation process with films 810, 811 being as the anode electrode. During this process the anode oxidation selectively progresses only at the side walls of each film 810, 811. This is because of the fact that a lamination of the dense film 807 and mask segments 808, 809 resides on the upper surface of films 810, 811. As a result, porous oxide films 812, 813 are grown to a thickness of several micrometers on the side walls of films 810, 811. The progressive distance of such anode oxidation— i.e., the thickness of side-wall oxide films 812, 813—is 700 nm by way of example. The anode oxidation distance will determine the length of lightly-doped regions to be formed later. Our experimentation suggests that the thickness of films 812, 813 preferably falls within a range of from 600 to 800 nm. At this stage the structure of FIG. 8D is with gate electrodes 81, 82 as shown.

Figure 8E:
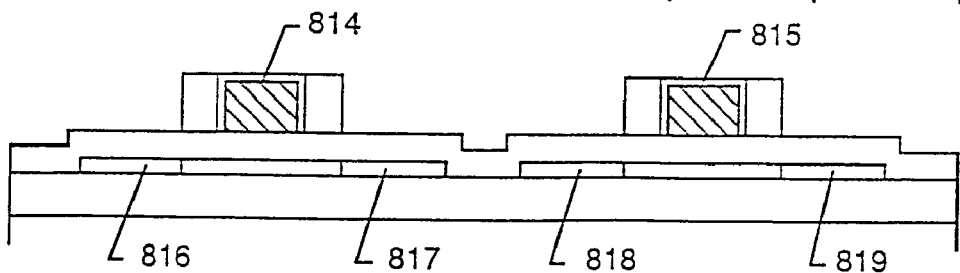

After the resist masks 808, 809 are removed away, the structure of FIG. 8D is again subjected to the anode oxidation using similar electrolytic solution. During this process the solution attempts to enter and fill the inside of porous sidewall oxide films 812, 813. Dense anodic oxides 814, 815 are thus formed as shown in FIG. 8E. These oxides are typically 50 to 400 nm thick. This thickness is controllable by adjustment of external application voltages. Any residual portions of the earlier formed dense oxides 807 become integral with oxides 814, 815.

At the step of FIG. 8E the resultant structure is doped with an N type impurity such as phosphorus (P) over the entire surface thereof. The charge dose is as high as $2 \times 10^{14}$ to $5 \times 10^{15}$ cm$^{-2}$; preferably, the dose ranges from 1 to $2 \times 10^{15}$ cm$^{-2}$. Known plasma- or ion-doping techniques are employed. As a result, heavily-doped regions 816-819 are defined in the mono-domain active layers 803, 804 as shown in FIG. 8E. One pair 816, 817 is self-aligned with its corresponding gate electrode 81 having side-wall oxides 812; the other pair 818-819 is self-aligned with gate electrode 82 having side-wall oxides 813.

Thereafter, the side-wall oxide films 812, 813 are removed using chosen etchant of aluminum-mixed acid. At this time, active regions just beneath oxides 812, 813 remain essentially intrinsically pure in nature due to inhibition of any ion doping thereinto.

Figure 8F:
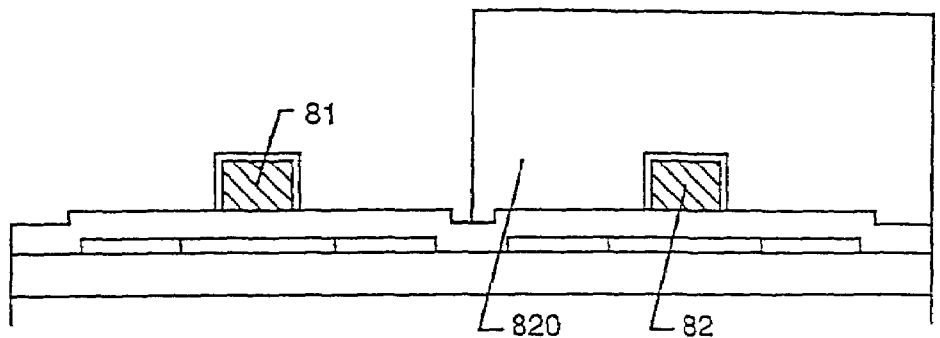

After removal of oxides 812, 813, as shown in FIG. 8F, a photoresist mask layer 820 is selectively formed covering the right-hand surface area in which a PTFT will be formed. The left-hand surface area of the structure of FIG. 8F is kept exposed as shown.

Figure 8G:
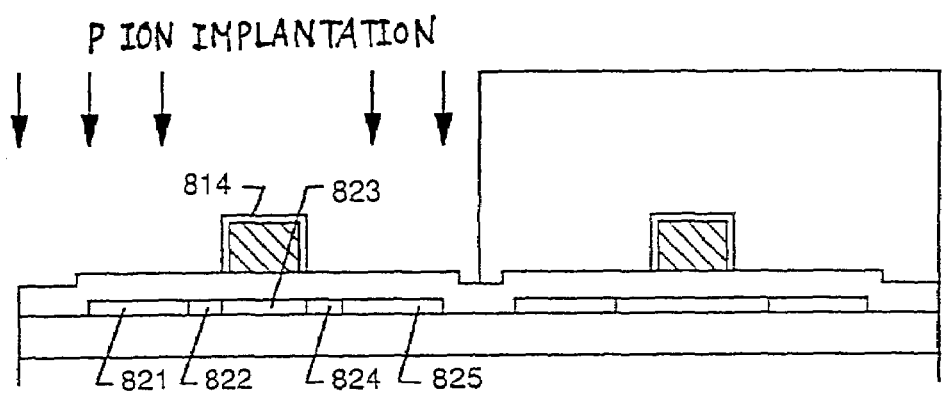

Then, as shown in FIG. 8G, the structure is doped with a P ion at a relatively low charge dose as compared to that at the step of FIG. 8E. The dose may be set at $1 \times 10^{13}$ to $5 \times 10^{14}$ cm$^{-2}$; preferably, $3 \times 10^{13}$ to $1 \times 10^{14}$ cm$^{-2}$. As a result of such impurity doping, spaced-apart lightly-doped regions 822, 824 are defined at selected portions of the mono-domain active layer 803, which portions have been located beneath the side-wall oxides 812 now removed away. These regions 822, 824 are self-aligned with the gate electrode 81 as shown.

Heavily-doped regions 821, 825 are also defined at outer locations of active layer 803 in such a manner that region 821 is in contact with region 822 whereas region 825 is with region 824. These outer heavily-doped regions 821, 825 will act as the source and drain of NTFT, respectively. Inner lightly-doped regions 822, 824 laterally lie at the opposite ends of an intrinsic channel formation region 823, which is self-aligned with the gate electrode 81. One region 824 which is between channel region 823 and drain 825 acts as the so-called "lightly-doped drain (LDD)" region.

It should be noted in FIG. 8G that non-doped regions (not shown) exist between the channel 823 and lightly-doped regions 822, 824 because of the fact that the presence of thin oxide 814 covering the surface of gate electrode 81 eliminates ion injection thereinto during the impurity doping. Such non-doped regions are equivalent in width to the thickness of oxide 814, and are generally called the "off-set gate" regions in the art to which the invention pertains. The offset gate regions are essentially intrinsic with no impurity doped thereinto; however, in the absence of any gate potentials, they do not contribute to formation of a channel and therefore function as a resistance component which weakens the intensity of internal electric field to suppress or eliminate deterioration of material quality increasing the useful life of TFTs. Note here that where the offset width is decreased, resultant offset regions will no longer exhibit such functions. In this respect, however, any quantitative analysis thereon has not been completely established yet until today.

Figure 8H:
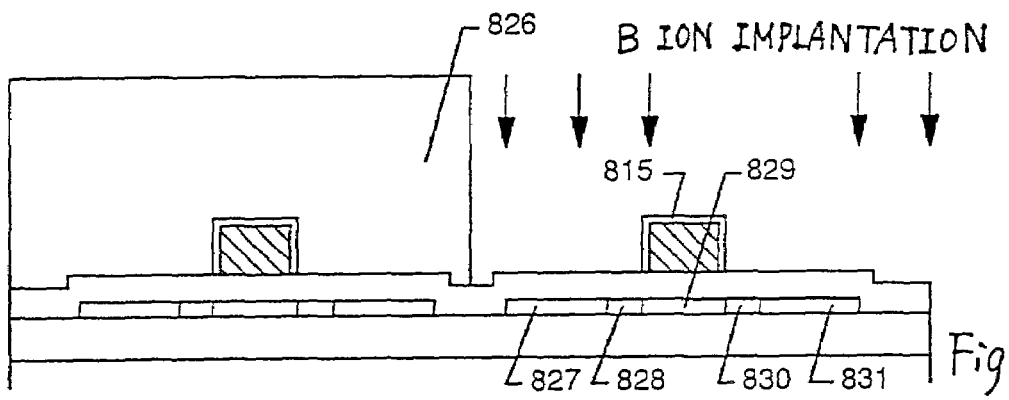

After formation of the NTFT, as shown in FIG. 8H, the resist 820 is removed, and another patterned photoresist layer 826 is then deposited covering the NTFT at the left-hand side in the illustration. With this resist 826 as a mask, a P-type impurity, such as boron (B), is doped into the structure of FIG. 8H. The charge dose is $2\times10^{14}$ to $1\times10^{16}$ cm$^{-2}$; preferably, 1 to $2\times10^{15}$ cm$^{-2}$, though it may alternatively be the same as that at the step of FIG. 8E if required. Doped regions 827, 831 are thus defined at opposite sides of the mono-domain active layer 804. While these regions may contain both N-type and P-type impurities, these essentially function as contact pads for electrical interconnection with associated takeout electrodes. In other words, unlike the left-hand side NTFT structure, the PTFT functionally distinguishes the regions 827, 831 from its source and drain regions. In this respect, it will be seen that the source and drain of PTFT consist of other doped regions 828, 830 as self-aligned with its corresponding gate electrode 82, respectively. These regions 828, 830 have been defined by injecting only B ions into the locations that have been essentially intrinsic in nature. For this very reason any other ions do not exist here facilitating the controllability of impurity concentration, which in turn enables achievement of PI junctions excellent in matching property while reducing crystal irregularity otherwise occurring due to ion injection. Note that the formation of offset gate regions remains available by use of the oxide film 815 covering the surface of gate 82 if required in some cases; however, the illustrative structure does not come with such offset regions by taking account of the fact that PTFTs will hardly degrade as compared to NTFTs as demonstrated by the experimentation made by the present inventors.

In this way, as shown in FIG. 8H, the source and drain regions 828, 830 are formed in the mono-domain active layer 804 of PTFT. An intermediate non-doped region positioned between source and drain 828, 830 defines a channel formation region. The doped-regions 827, 831 at the opposite side portions of active layer 804 will act as contact pads for supplying current to source 828 or deriving it from drain 830.

Figure 8I:
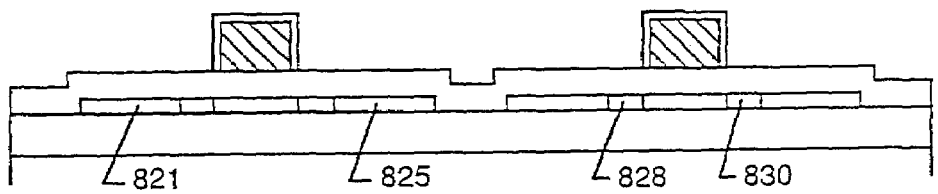

After the resist 826 is removed, as shown in FIG. 8I, the resultant structure is then irradiated with a laser beam for activation of doped impurity as well as annealing of doped-regions. The laser irradiation may be carried out while reducing a difference in crystallinity between a pair of source and drain regions 821, 825 of NTFT and another pair of source and drain regions 828, 830 of PTFT. Absence of clear difference of crystallinity therebetween is originated from the fact that source and drain regions 828, 830 are not significantly damaged during the ion injection at the step of FIG. 8H. Accordingly, the laser annealing may cure the doped source and drain regions of the both TFTs to ensure that P- and N-channel TFTs are similar or identical in transistor characteristics to each other.

Figure 8J:
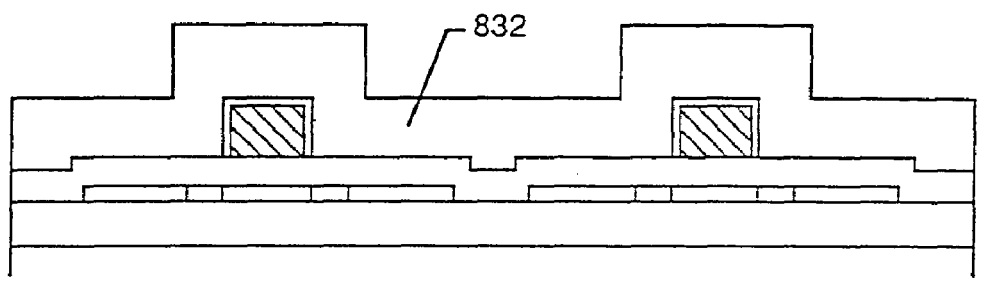

Next, as shown in FIG. 8J, an interlayer dielectric film 832 is deposited, by plasma or thermal CVD techniques, to a thickness of 400 nm on the entire surface of the structure of FIG. 8I. Film 832 is made of silicon oxide, silicon oxynitride, silicon nitride, or any combinations thereof in a multilayer manner.

Figure 8K:
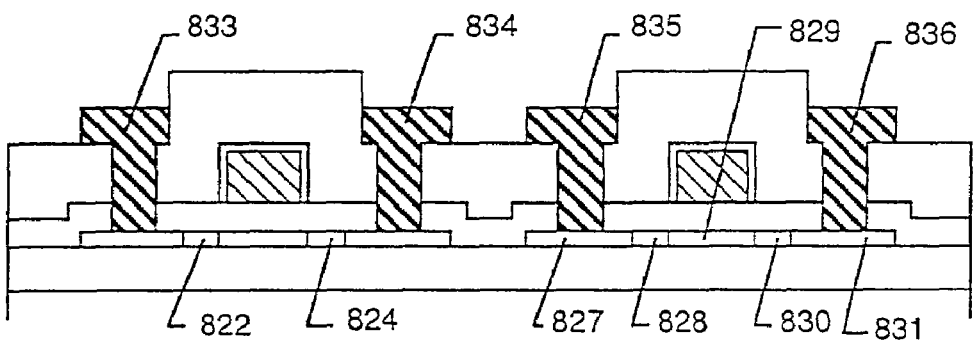

Finally, as shown in FIG. 8K, several required openings are defined as contact holes in the interlayer film 832. Patterned conductive films 833-836 are then selectively formed to fill the contact holes to act as source and drain electrodes of P- and N-channel TFTs. A wiring pattern is also formed allowing the drain electrode 834 of NTFT to be electrically coupled to that 836 of PTFT while permitting interconnection between the insulated gate electrodes 81, 82 thereof. A CMOSTFT structure is thus completed, which is applicable to advanced high-speed/high-precision display panels, including active-matrix LCDs, active-matrix electro-luminescence (EL) devices, and others.

One significant importance of the illustrative TFT manufacture scheme is that at the steps of FIGS. 8E, 8G and 8H, the mono-domain active layers 803, 804 are completely covered on surface by the silicon oxide film 805 which will act as the gate insulation films after patterning. Performing ion-doping with active layers 803, 804 covered by oxide 805 may advantageously serve to reduce the risk of occurrence of irregularity and residual contamination on the active layer surface. This will greatly contribute to an increase in production yield as well as reliability of resultant TFTs.

It should be noted that the mono-domain crystalline silicon film 211 as shown in FIG. 2F may alteratively be fabricated on a semiconductor substrate such as a silicon wafer. In this case it is required that an additional dielectric film be deposited on the top surface of the substrate. A known thermal oxide film may be employed for this purpose. A heat treatment therefor is done at temperatures typically ranging from 700 to 1300° C. for a predefined length of time period, which may vary with a change in target thickness. The thermal oxidization process is carried out in a chosen atmosphere that burns $O_2$, $O_2$—$H_2O$, $H_2O$, $O_2$—$H_2$. The recent advance in the semiconductor technology suggests that the oxidization may alternatively be done in the atmosphere containing therein chosen halogen elements, such as HCl, $Cl_2$ or the like. Since silicon wafers are a key to the recent semiconductor microfabrication technology due to the extended capability of forming thereon several types of semiconductor elements. Forming the mono-domain silicon film on such semiconductor wafers may further extend the applicability of the present invention in combination of the currently available silicon-wafer fabrication techniques.

Turning now to FIGS. 9A to 9D, a fabrication method of the mono-domain crystalline silicon film in accordance with a further embodiment of the invention is shown, which is designed to form a TFT structure with such film being laid over an integrated circuit (IC) as preformed on a silicon wafer under manufacture.

Figure 9A:
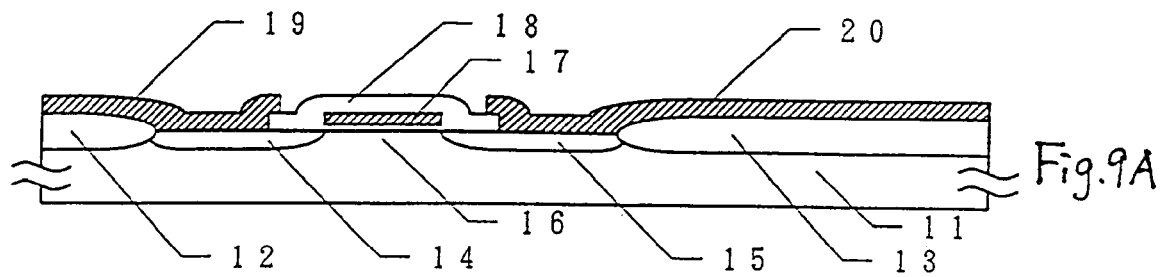
FIGS. 9A to 9D illustrate in schematic cross-section some of the major steps in the formation of a semiconductor device in accordance with a further embodiment of the invention.

In FIG. 9A, there is shown a MOSFET IC device (not shown to scale) which has been fabricated using known microfabrication techniques. This IC comes with a silicon substrate 11 having a top surface on which MOSFETs are formed along with associated element-separation dielectric layers 12, 13 as typically formed in a thermal oxide film. A MOSFET has spaced-apart source and drain regions 14, 15 in the surface of substrate 11. These may be fabricated through the injection step of doping an impurity of a selected conductivity type into substrate 11 and successive diffusion step. As readily recognized by a skilled person in the art, where substrate 11 is of P conductivity type, an N-type impurity such as phosphorus (P) is chosen for injection; if substrate 11 is of N type then a P-type impurity such as boron (B) is doped thereinto. The MOSFET also has a channel formation region 16 as defined between the source 14 and drain 15 in the substrate surface, and an insulated gate electrode 17 overlying the channel 16. Gate electrode 17 may be made of polycrystalline silicon, or polysilicon. Gate 17 is electrically insulated from substrate 11 by a gate insulation film which is sandwiched therebetween. As experts readily recognize, this film may be a residual portion of the thermal oxide film as has been formed with thickness control during the diffusion step after ion injection for forming source 14 and drain 15. Gate 17 is covered by a silicon oxide film 18 for electrical isolation from a source electrode 19, a drain electrode 20 or other adjacent components on substrate 11.

Figure 9B:
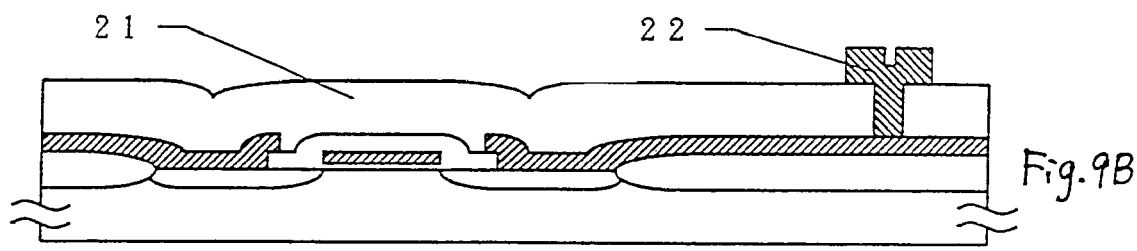

As shown in FIG. 9B an interlayer dielectric film 21 is deposited on the MOSFET-IC structure of FIG. 9A. Film 21 may be made of silicon oxide, silicon nitride, or others. A contact hole is defined in film 21 at a selected location. A patterned conductive wiring layer 22 is then formed as a chip lead, permitting electrical interconnection of drain electrode 20 to any required part or parts of the IC.

Figure 9C:
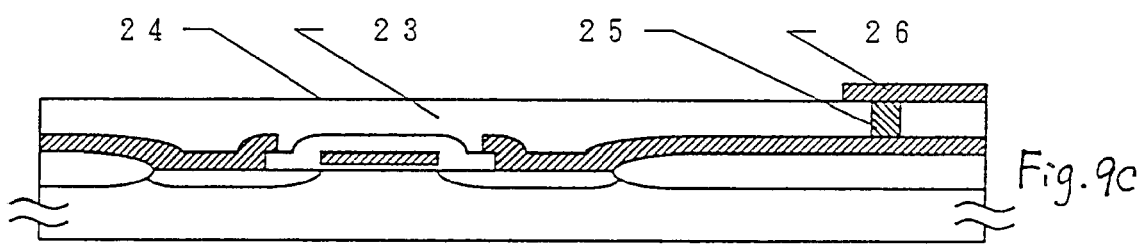

The structure of FIG. 9B is next subjected to surface polishing process using known chemical and mechanical polishing (CMP) techniques, obtaining a surface-flattened IC structure shown in FIG. 9C. As shown, due to such surface polish treatment, a resultant interlayer dielectric layer 23 exhibits flat, smooth top surface 24 with any undesired projections of lead 22 being removed away from it. In FIG. 9C numeral 25 designates flattened portion of lead 22, on which a lead 26 is formed for interconnection with drain electrode 20. It is recommendable that the source electrode 19, drain electrode 20 and lead 26 be made of carefully chosen heat-resistant material that is capable of withstanding against application of heat as increased up to 1100° C. This is in view of later heat application during formation of a mono-domain crystalline active layer.

Figure 9D:
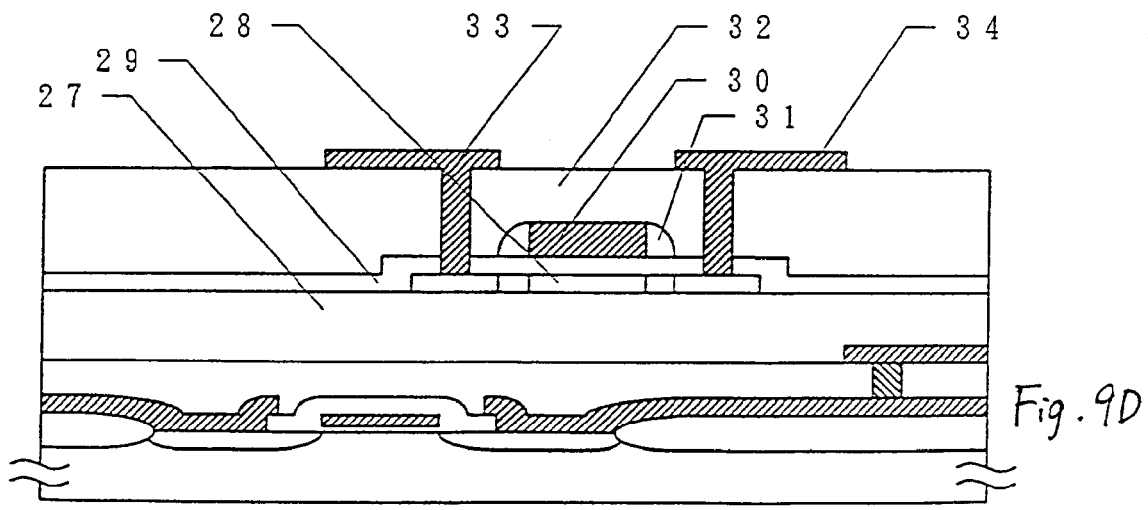

Next, as shown in FIG. 9D, an interlayer dielectric film 27 is deposited on the entire surface of the structure of FIG. 9C. A mono-domain crystalline silicon film which acts as the active layer of a TFT will be formed on this film 27. The formation of such active layer is similar in principle to that shown in FIGS. 2A-2F. More specifically, a patterned mono-domain crystalline silicon active layer 28 is formed on interlayer dielectric film 27. A gate insulation film 29 is deposited covering film 27 and active layer 28. A gate electrode 30 is then formed insulatively overlying a channel region of active layer 28. A chosen impurity of a selected conductivity type is next doped into active layer 28.

After injection of impurity, insulators 31 are selectively formed on the opposite side walls of gate electrode 30. Formation of such side-wall insulators 31 includes the steps of depositing a silicon oxide film (not shown) which is greater in thickness than gate 30 and which covers the entire surface thereof, and performing anisotropic dry etching to remove selected portions of such insulative film, thereby causing an insulator to be reside only at a respective one of the opposite side walls of gate 30 as shown.

A further injection of impurity is performed defining in active layer 28 the heavily-doped source and drain regions while allowing certain parts shielded by side-wall insulators 31 to remain as lightly-doped regions. Impurity activation process is then carried out using heat treatment and/or laser-beam irradiation. Thereafter, a dielectric film which may be made of silicon oxide or silicon nitride is deposited as the interlayer insulation layer. This layer is subject to etching process forming contact holes therein. Finally, source and drain electrodes 33, 34 are formed providing electrical interconnections of source and drain in active layer 28 through the contact holes.

A significant advantage of the embodiment shown in FIGS. 9A to 9D is that a multiple-layered or "three-dimensional (3D)" structured TFT can be fabricated on or above the presently available IC devices. Specifically, with the 3D MOS-IC/TFT structure of FIG. 9D, the upper TFT can exhibit extra enhanced transistor actions that may be equivalent in speed and reliability to the lower standard MOSICs as fabricated on single-crystalline base plate such as silicon wafer or substrate 11 depicted. This advantageously serves to offer an increased integration or packing density for IC devices without having to reduce their inherent performance.

Figure 10:
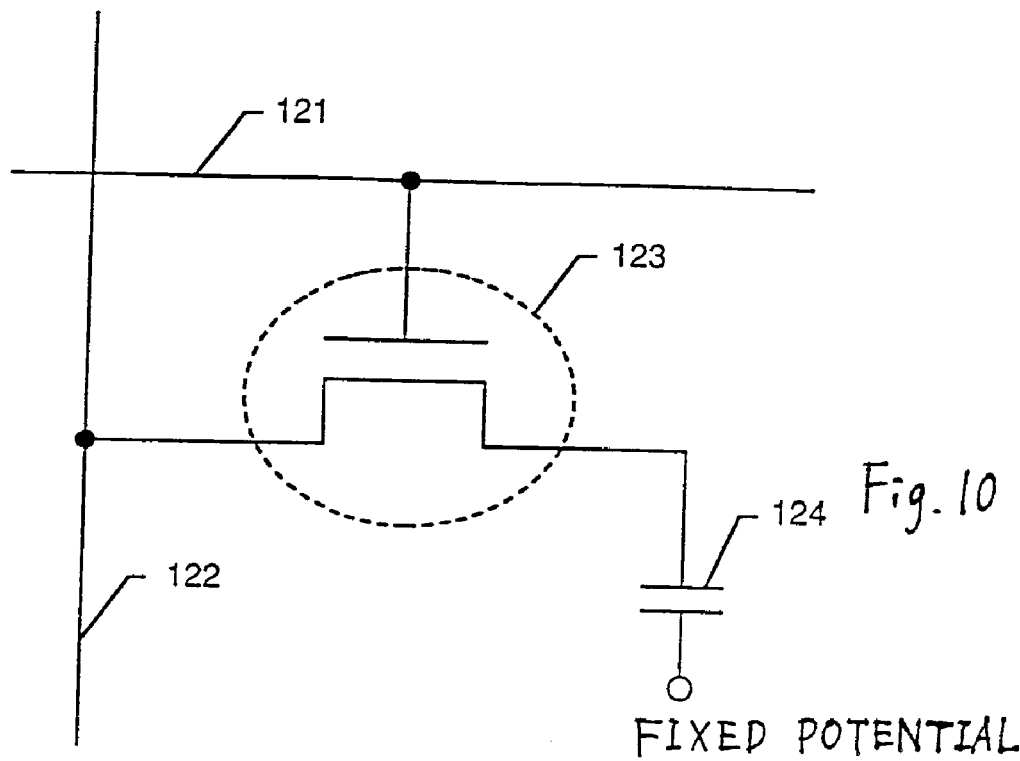
FIGS. 10 and 12 depict one cell section of a memory array of a dynamic random access memory (DRAM) and that of a static RAM (SRAM)
Figure 11:
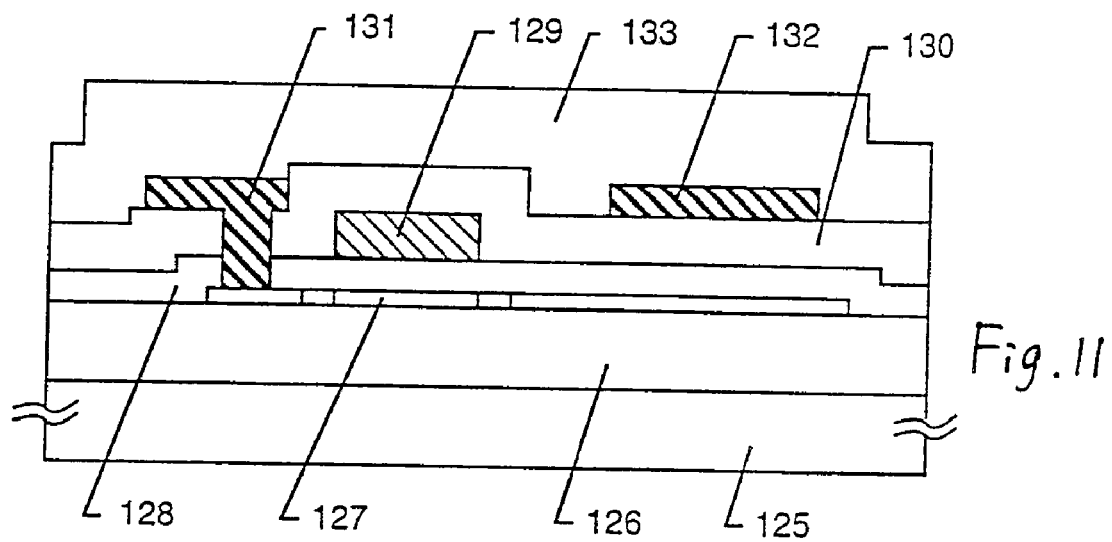
FIGS. 11 and 13 show cross-sections of each of the cells of the preceding figures.

A dynamic random access memory (DRAM) device embodying the present invention is shown in FIGS. 10 and 11, which employs the TFT structure of the invention. The DRAM includes an array of one-capacitor/one-transistor memory cells, one of which is visible in FIG. 10. As shown, the memory cell includes a data transfer transistor 123 having a gate coupled to a corresponding one of parallel word lines 121, a source coupled to a corresponding bit line 122, and a drain. Transistor 123 is a TFT with an active layer made of the mono-domain crystalline silicon film as has been described previously. The cell also includes an associative data storage capacitor 124 having one electrode coupled to the drain of TFT 123, and the other electrode as coupled to a fixed potential, such as ground. In the DRAM cell of FIG. 10, upon application of a voltage signal of a selected potential at the word line 121, this potential is applied to the gate rendering TFT 123 conductive. This allows a data signal to be transferred from bit line 122 through TFT 123 to capacitor 124 causing corresponding charge carriers to be accumulated or stored therein for data write. During read operation the stored carriers are transferred via TFT 123 to bit line 122.

See FIG. 11, which illustrates a cross-sectional view of the DRAM cell of FIG. 10. As shown, a silicon substrate 125 has a top surface on which a silicon oxide film 126 is formed providing the so-called semiconductor-on-insulator (SOI) structure. Film 126 may be a thermal oxide layer. Formed on film 126 is a TFT having a mono-domain crystalline silicon active layer 127 in accordance with the principle of the present invention.

As apparent from viewing FIG. 11, the active layer 127 is covered with an overlying gate insulation film 128, on which an insulated gate electrode 129 is arranged. An interlayer insulation film 130 is laminated on film 128 covering the gate 129. Film 130 has a contact hole through which a source electrode 131 is electrically coupled to the source region in active layer 127 in a manner similar to those of the previous embodiments. Source electrode 131 is also coupled to a corresponding bit line 122 of FIG. 10. Another conductive layer 132 is on the interlayer insulation film 130 as one electrode of the data storage capacitor 124 of FIG. 10, which defines a predefined capacitance between it and the underlying drain region of TFT in active layer 127. Source electrode 131, capacitor electrode 132 and bit line 122 are formed at a time. An insulating layer 133 covers the entire top surface of the cell as a protective layer.

A significant feature of the embodiment shown FIGS. 10 and 11 is that leak current can be suppressed or eliminated. This can be said because the TFT 123 is employed to form the SOI structure in the low-cost/high-integration one-capacitor/one-transistor DRAM cell minimizing the junction area, which in turn leads to an increase in data-storage reliability.

Another advantage is to enable achievement of low-voltage operations due to the fact that the SOI-DRAM cell structure permits a decrease in the storage capacitance without reducing reliability and performance.

Figure 12:
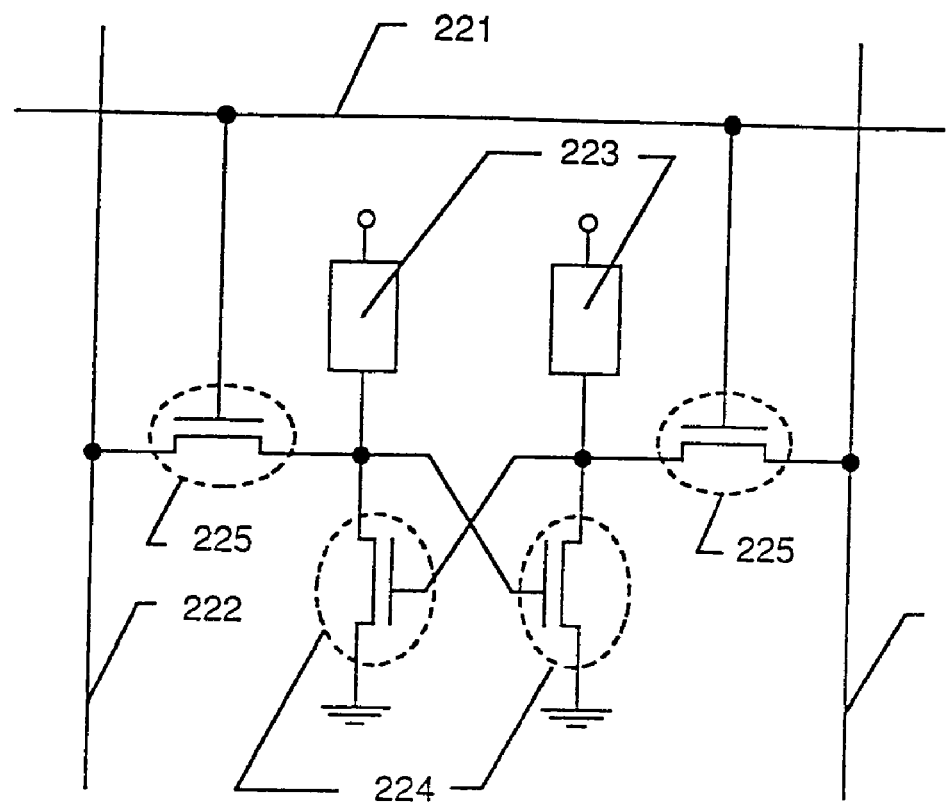
Figure 13:
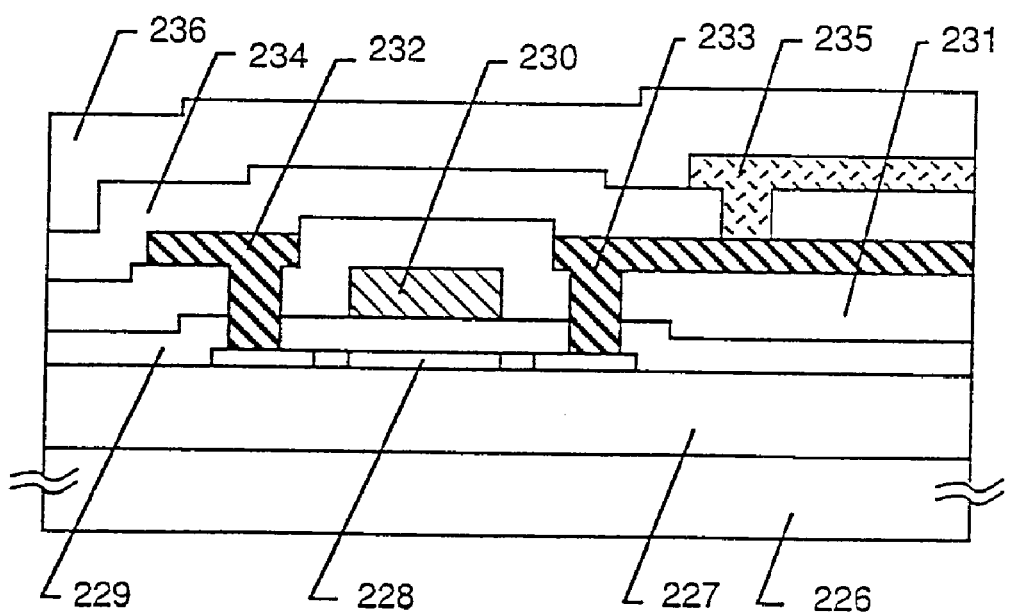

A static random access memory (SRAM) device embodying the present invention is shown in FIGS. 12 and 13, which also employs the TFT structure of the invention. The SRAM includes an array of NMOS or CMOS memory cells each of which has bistable flip-flop (F/F) circuitry as shown in FIG. 12. The SRAM cell statically stores therein a binary one-bit datum of logic "0" or "1" depending upon whether the F/F circuit turns on or off insofar as application of power continues. As shown in FIG. 12, the cell is at an intersection between a word line 221 and a pair of bit lines 222, and includes a F/F circuit which is constituted from a pair of cross-coupled driver transistors 224, and associative high-resistance load elements 223. One pair of load 223 and transistor 224 is interconnected at a common node to one bit line 222 via an access transistor 225 having a gate coupled to the word line 221; the other pair of load and transistor is connected to the other bit line 222 through a similar access transistor 225.

A cross-sectional view of a TFT for use in the SRAM cell is shown in FIG. 13. A substrate 226 may be made of quartz or silicon. A silicon oxide film 227 is on substrate 226 as the primary coat layer on which a mono-domain crystalline silicon active layer 228 of the TFT is formed. Active layer 228 is covered by a gate insulation film 229, on which a patterned gate electrode 230 is formed. An overlying interlayer dielectric film 231 has contact holes through which source and drain electrode 232, 233 are electrically coupled to the source and drain regions in active layer 228 as formed in the manner as described previously. Source and drain electrodes 232, 233 are fabricated along with bit lines 222. An interlayer dielectric film 234 and a polycrystalline film 235 are laminated in this order. The latter film 235 acts as the high-resistance load element 223 of FIG. 12. The overall multilayer structure is covered by a protective film 236 made of a chosen dielectric material. With such an arrangement, the SRAM cell can exhibit high speed operations with reliability and mountability maximized. This is due to the use of the TFT having mono-domain active layer 228 as fabricated on the SOI substrate structure.

Figure 14:
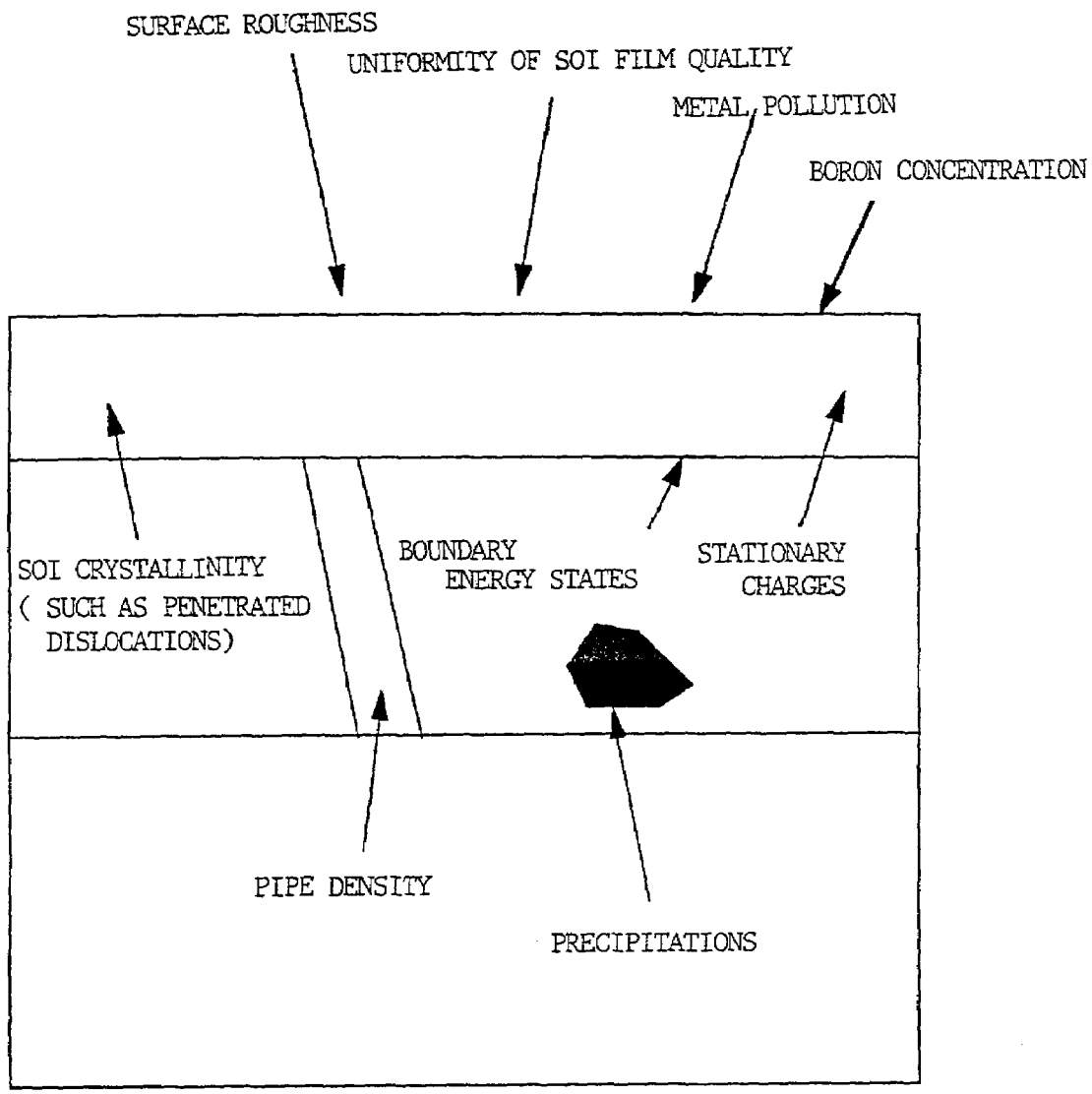
FIG. 14 is a diagrammatic representation for explanation of problems faced with a known semiconductor-on-insulator (SOI) structure.

One characterizing feature of the TFT-SOI structures shown in FIGS. 11 and 13 is the capability of successfully suppressing or eliminating inclusion of any bad parameter elements which can affect or disturb the crystal characteristics such as pipe density, interface level, fixed charge, penetration transition, and the like in resultant mono-domain crystalline active layers. More specifically, while the SOI structure may exhibit an enhanced reduction in power dissipation as a result of recent developments, it still suffers from a problem. See FIG. 14. This diagram is an illustration summarizing several possible factors that can affect the crystallinity in one typical SOI structure: the level of interface and fixed charge in a silicon film, which are originated from the crystal structure; and, metal contamination and concentration of boron—these are due to external influence. Bad behavior of such factors can be minimized by the fabrication method of the present invention, which specifically includes the step of heating the crystalline silicon film in the atmosphere containing halogen elements, thereby allowing both single-crystallization of silicon film and gettering of metallic element to be carried out at a time. Execution of the gettering process removes away any possible metal contamination therein. This mainly owes to the halogen elements' action, which may secondarily serve to increase in number dangling bonds of silicon atoms that have been disengaged from nickel atoms. The single-crystallization by thermal annealing process exhibits an advantage that bad factors can be suppressed or eliminated such as pipe density, interface level, fixed charge, penetration transition, and others. Insofar as the deposits or precipitates illustrated in FIG. 14 are silicide-based materials, these can be successfully removed away by the getter action of halogen elements. If such are oxide materials, these will be expected to disappear as a result of oxygen's re-separation for diffuse during the heat treatment.

It should be noted that the TFT structure with the mono-domain active layer shown in FIG. 3E and the CMOSTFT of FIG. 8K are combinable for integration on a single substrate, providing an LCD panel having an active-matrix display section and associated peripheral driver circuitry for electrically driving the same on the same panel substrate which may be made of quartz or silicon. The active-matrix LCD panel includes an array of rows and columns of active-matrix pixels, each of which includes at least one switching TFT. The driver circuit is on the periphery of panel substrate around the pixel array. The TFT structure of FIG. 3E which is equivalent in performance to single-crystalline MOSFETs is employed as such pixel TFTs whereas the CMOSTFT of FIG. 8K as the driver TFTs.

A significant advantage of this embodiment is that the turn-off current in pixel transistors can be reduced or minimized. The reason of this is as follows: Since the TFT active layer consists of the mono-domain crystalline silicon film as mentioned previously, there are no longer present any crystal grain boundaries otherwise badly serving to create a current path through which the turn-off current can rash to flow at increased priority. This in turn increases retainability of a packet of signal charge at the individual pixel electrode.

Another advantage of this embodiment is that the driver CMOSTFTs can be enhanced in performance as well as in equalization of transistor characteristics between PMOSTFTs and NMOSTFTs, by use of the CMOSTFT structure of FIG. 8K.

One modification of the fabrication process shown in FIGS. 3A to 3E is as follows. In a manner similar to that of the process as discussed in connection with FIGS. 2A-2F, a semiconductor thin film is formed containing therein a mono-domain region, which is selectively used to provide the TFT active region.

Then, an insulating film mainly comprised of silicon is deposited by CVD or PVD techniques to a predetermined thickness, for example, 20 to 150 nm—preferably, 80 nm—covering the active layer. The insulating film is made of silicon oxide, silicon oxynitride, silicon nitride, or the like. The thickness was carefully selected pursuant to the dielectric breakdown voltage as finally required for TFTs manufactured.

After formation of the silicon oxide film, a further—here, third—heat treatment is performed in the atmosphere containing therein halogen elements. This process is similar in condition to the second heat treatment mentioned earlier.

During execution of this third heat treatment, the metallic element such as nickel which remain within the active layer are reduced in amount, improving the crystallinity of the mono-domain region accordingly. During this process, thermal oxidation reaction progresses at the interface between the active layer and the above silicon oxide film forming a thermal oxide film of 20-nm thick. At this time it will be recommendable that the final thickness of active layer fall within a range of 20 to 30 nm, preferably at 25 nm. This may advantageously serve to reduce or minimize the turn-off current in magnitude.

After completion of the third heat treatment, the resultant structure is subjected to a still further heat treatment at 950° C. for one hour in the atmosphere of nitride gas, for curing any possible heat damage of the thermal oxide and silicon oxide films to improve the film quality. Furthermore, as a result of the heat treatment in the atmosphere containing halogen, halogen elements can continue residing at an increased concentration near the interface between the active layer and an overlying gate insulation film. It is shown by our SIMS measurement that the concentration of halogen ranges from $1\times10^{19}$ to $1\times10^{20}$ atoms/cm$^3$. Note also that the thermal oxide film formed at the interface between the active layer and silicon oxide will be used to constitute the gate insulation film along with the silicon oxide film. Any defective levels and interlattice silicon atoms are reduced during formation of the thermal oxide film, enhancing the resulting interface state between the active layer and the gate insulation film. As has been described in connection with the embodiment of FIGS. 2A-2F, the active layer exhibits a maximized flatness on its top surface; accordingly, the thermal oxidation reaction progresses regularly rendering the gate insulation film uniform in thickness. This improves the interface state while enhancing the withstanding or breakdown voltage characteristics of the gate insulation film.

An advantage of this embodiment is that inclusion of metallic element such as Ni can be reduced in the active layer while causing the interface to be excellent in state between the active layer and its overlying gate insulation film. This leads to the capability of providing semiconductor devices with enhanced electrical characteristics and reliability. Optionally, both the second heat treatment of the embodiment shown in FIGS. 2A-2F and the third heat treatment of the above embodiment may be done at a time. To do this, the crystalline silicon film 207 of FIG. 2D—this film is prior to execution of the first heat treatment—is patterned forming the active layer, which is then subject to the prescribed process of this embodiment.

The aforesaid embodiment is modifiable to attain improvements in state of the interface between the active layer and insulation film in a different manner, as will be set forth below.

First, like the embodiment method shown in FIGS. 2A-2F, a semiconductor thin film containing a similar mono-domain region is formed, which is selectively used for formation of the TFT active layer. A silicon oxide film is then deposited thereon to a thickness, such as 20 to 150 nm, by using CVD or PVD techniques. Resultant structure is then subject to heat treatment at 500 to 700° C., typically, 640 to 650° C. This temperature range may define nearly the lower limit for permitting execution of thermal oxidation. The heat treatment here may be performed in the atmosphere of oxygen gas only or alternatively containing halogen elements. Still alternatively, a "wet" atmosphere may be employed which contains moisture vapor. The heat treatment is carried out for 0.5 to 2 hours depositing a thermal oxide film which measures in thickness less than 10 nm, typically, 1 to 9 nm. The growth of such thermal oxide will be completed when its thickness becomes equivalent thereto.

An advantage of this modification is that superior inference state is obtainable between the active layer and gate insulation film, by reducing or removing any residual fixed charge or defective levels at or near the interface. The reduction or absence of such defects is accomplished by thermally oxidizing only a limited shallow region of the top surface section of active layer, which region is 1 to 3 nm in depth or thickness. In other words, with this embodiment, excellent interface state can be achieved by specifically forming a very thin thermal oxide film being limited in thickness. The oxidation here may refer to rendering the active layer thinner by 1 to 3 nm while forming a new thermal oxide film of 2 to 6 nm thick. One possible explanation for the capability of obtaining such good interface is that the presence of residual fixed charge and/or crystal defects tend to collect exclusively in the above-identified shallow surface region of the active layer which falls within a narrow region of 1 to 3 nm as spanning the active layer and gate insulation film with the interface being as a center; therefore, by removing and replacing the shallow surface region with the thermal oxide, it becomes possible to eliminate inclusion or presence of such defects almost completely.

Another advantage of this modification is that the manufacture of semiconductor devices can be improved in efficiency—namely, throughput—due to the fact that the thermal oxidation process as used herein can be performed at relatively lower temperatures, reducing the duty (burden) of equipment employed therefor.

Turning now to FIGS. 16A to 16D, there is shown a TFT fabrication process in accordance with a further embodiment of the invention, which employs polycrystalline silicon (polysilicon) film as the gate electrode of a TFT under manufacture.

Figure 16A:
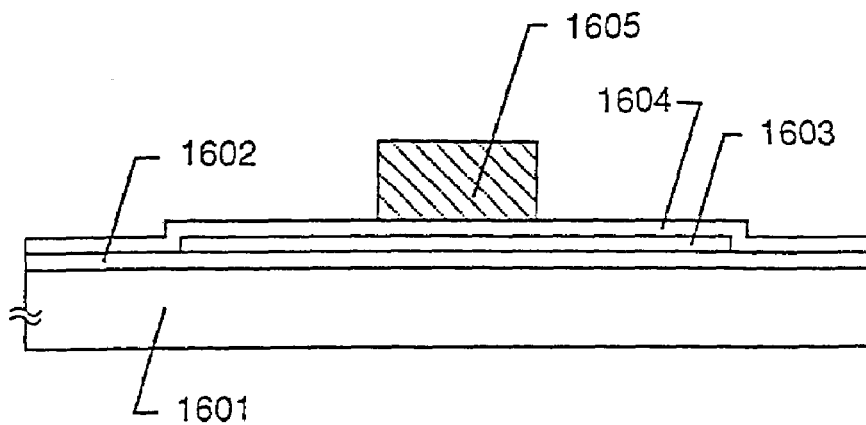
FIGS. 16A to 16D illustrate in schematic cross-section some of the major steps in the formation of a semiconductor device in accordance with a further embodiment of the invention.

In FIG. 16A, an insulating substrate 1601 is prepared which may be made of glass. The glass substrate 1601 has a top surface on which there are sequentially formed a primary coat film 1602, a patterned mono-domain crystalline active layer 1603, a gate insulation film 1604, and a patterned gate electrode 1605. Active layer 1603 is fabricated using the embodiment process as previously discussed in connection with FIGS. 2A-2F. Gate 1605 may be made of polysilicon.

Figure 16B:
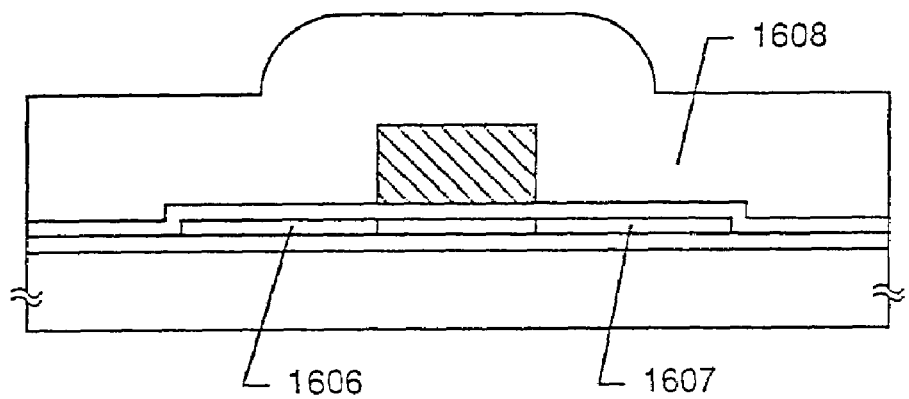

The structure of FIG. 16A is then doped with an impurity by known ion implantation techniques so that spaced-apart doped regions 1606, 1607 are defined in the active layer 1603 in such a manner that these are self-aligned with the overlying gate 1605 as shown in FIG. 16B. Then, a dielectric film 1608 is deposited to a thickness of 0.5 to 1 µm, by low pressure CVD, plasma CVD or sputter techniques, on the resultant structure. Film 1608 may be made of silicon oxide or silicon nitride.

Figure 16C:
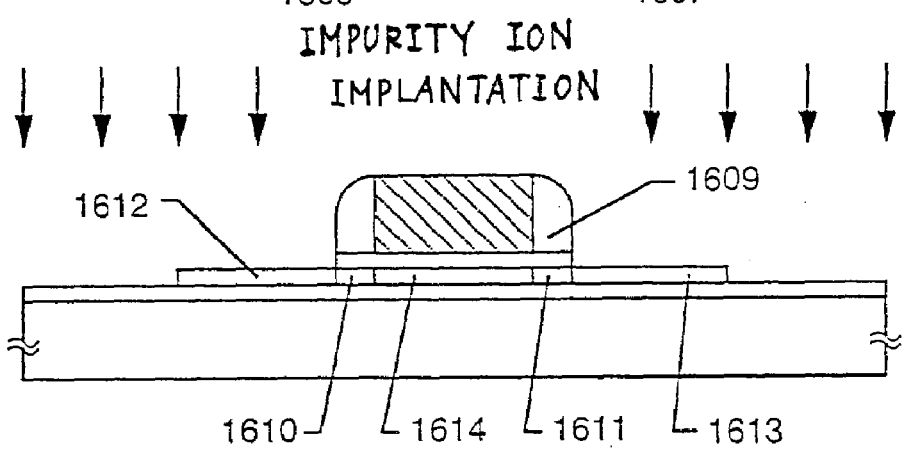

Then, the structure of FIG. 16B is subject to etch-back process to selectively etch the overlying film 1608 causing only parts of it to reside on the opposite side walls of gate 1605 as shown in FIG. 16C. These side wall insulators are designated by numeral 1609 herein. During the etching, the gate insulation film 1604 is also etched, and most of it is removed away which excludes certain part underlying a mask consisting of gate 1605 and side-wall insulators 1609.

Next, the structure of FIG. 16C is again doped with a chosen impurity by ion implantation techniques. The charge dose here is greater than that at the prior impurity ion implantation. During the second ion implantation certain regions 1610, 1611 just beneath side-wall insulators 1609 are kept unchanged in impurity concentration due to the fact that no impurity is implanted thereinto. The remaining, exposed regions 1612, 1613 of active layer 1603 are further doped with impurity ions to increase the concentration of doped impurity therein. Through the first and second ion implantation steps, active layer 1603 comes to have heavily-doped source and drain regions 1612, 1613 as well as lightly-doped LDD regions 1610, 1611 positioned just beneath side-wall insulators 1609. Active layer 1603 also has a non-doped intermediate region 1614, which is just beneath gate 1605 and will act as a channel formation region in resultant TFT.

Figure 16D:
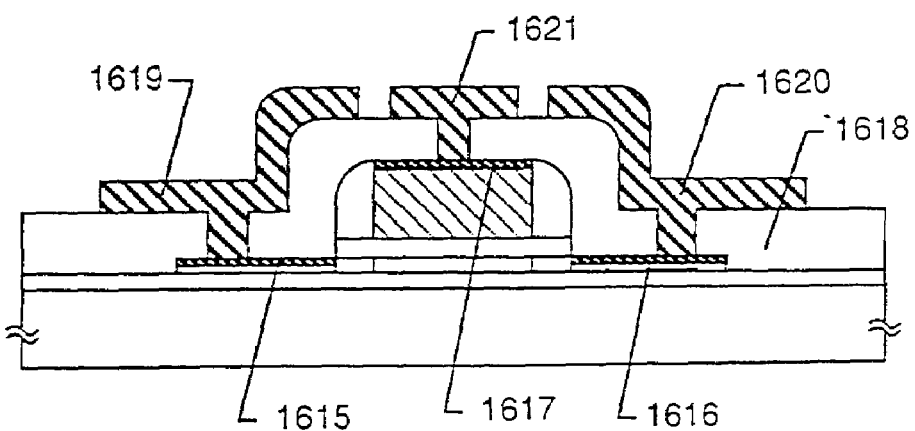

A titanium film (not shown) of 30 nm thick is now formed on the structure of FIG. 16C, causing this to chemically react with the silicon film. After the titanium film is removed away, resultant structure is heated by known ramp annealing techniques to form titanium-silicide films 1615-1617 on the exposed surface areas of source 1612, drain 1613 and gate 1605 as shown in FIG. 16D. Note that the titanium film may be replaced with any one of tantalum, tungsten and molybdenum films. Then, a silicon oxide film 1618 is deposited as the interlayer insulator to a thickness of 500 nm; next, several types of suitably patterned leads 1619-1621 for electrical interconnection of source 1612, drain 1613 and gate 1605, are formed thus completing a TFT structure shown in FIG. 16D.

An advantage of this embodiment is that good ohmic contacts can be attained in the TFT structure because of the fact that electrical interconnections are made between the TFT and leads via titanium-silicide films 1615-1617.

Any one of the foregoing TFTs embodying the invention may be applicable to a wide variety of types of semiconductor devices, including electrooptical display panels such as active-matrix LCD, EL or EC devices; memory devices such as DRAMs, SRAMs, VRAMs, SDRAMs, ROMs, PROMs, EEPROMs, Flash EEPROMs, NAND/NOR EEPROMs or the like; and any other equivalents which will be employed for advanced electronic apparatus or systems, such as TV cameras, head-mount display modules, motor vehicle navigation systems, front- or rear-projection display units, home-use video cameras, personal computers and others.

See FIG. 17A, which depicts a mobile computer. This computer is generally structured from a main body 2001, a camera section 2002, an image receiving section 2003, a control switch 2004, and a display unit 2005. The TFT of the present invention may be applied to ICs being assembled in display unit 2005 and main body.

A head-mount display is shown in FIG. 17B. This display is generally structured from a main body 2101, a display unit 2102, and a band section 2103. The display unit 2102 includes a pair of relatively small-size display panels.

A motor vehicle navigation apparatus is shown in FIG. 17C. As shown, this apparatus includes a main body 2201, a display unit 2202, control switches 2203, and antenna 2204. The semiconductor device of the instant invention may be applied as ICs for use in display unit 2201 and internal as built-in electronics. The display unit 2202 acts as a monitor for purposes of visual indication of road map images thereon; accordingly, this may be relatively extensive in allowable range of resolution.

A portable or handheld mobile telephone is shown in FIG. 17D, which comes with a main body 2301, an audio output section 2302, an audio input section 2303, a display unit 2304, control switches 2305, and an antenna 2306. The semiconductor device of the instant invention may be applied as ICs for use in display unit 2301 and built-in electronics.

A video camera is shown in FIG. 17E, which includes a main body 2401, a display unit 2402, an audio input section 2403, control switches 2404, a battery pack 2405, and a picture receiver 2406. The semiconductor device of the invention may be applied as ICs for use in display unit 2402 and built-in electronics.

A front projection apparatus is shown in FIG. 17F, which may be constituted from a main body 2501, a light source 2502, a reflection type display unit 2503, an optical system 2504 (including known beam-splitters, optical polarizers and the like), and an associated screen 2505. The screen 2505 is a large-size one adaptable for use in presentations for the meetings and academic conferences; it is thus required that the display unit 2503 be high in resolution.

The semiconductor device of the invention will also be applicable to any types of electrooptical modules or apparatus other than the illustrative ones, including rear-projection systems, portable electronic intelligent tools such as handy terminals. As is apparent from the foregoing, the present invention may offer increased applicability, covering almost all of the currently available electronic display systems.

It has been described that the present invention may enable formation or fabrication of mono-domain regions on a substrate having a dielectric surface, which regions are capable of being deemed substantially identical in crystal structure to the single-crystalline materials. This in turn enables achievement of a superior active layer of semiconductor devices such as TFTs by use of crystalline silicon films having the crystallinity as equivalent to single-crystals. This makes it possible to organize semiconductor circuitry with enhanced performance as equivalent to that of ICs as manufactured using currently available single-crystalline wafers.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A semiconductor device comprising:
   a substrate;
   a semiconductor film formed on and in contact with an insulating layer over the substrate;
   a first insulating film on the semiconductor film;
   a gate electrode over the first insulating film;
   a metal-silicide film on the gate electrode;
   a side wall insulator on a side surface of the gate electrode; and
   a second insulating film in contact with the side wall insulator and an upper surface of the metal-silicide film,
   wherein a thickness of the first insulating film is 2 to 6 nm, and
   wherein a bottom surface of the side wall insulator is in contact with an upper surface of the first insulating film.

2. The semiconductor device according to claim 1, further comprising an LDD region in the semiconductor film, the LDD region being overlapped with the side wall insulator.

3. The semiconductor device according to claim 1, wherein the semiconductor film is a mono-domain crystalline semiconductor film.

4. The semiconductor device according to claim 1, wherein the first insulating film is a thermal oxide film.

5. The semiconductor device according to claim 1, wherein a the gate electrode comprises polycrystalline silicon.

6. The semiconductor device according to claim 1, wherein the side wall insulator is made of silicon oxide or silicon nitride.

7. A semiconductor device comprising:
   a substrate;
   a semiconductor film formed on and in contact with an insulating layer over the substrate;
   a first insulating film on the semiconductor film;
   a gate electrode over the first insulating film;
   a side wall insulator on a side surface of the gate electrode;
   a source region and a drain region in the semiconductor film;
   a first metal-silicide film on the source region, a second metal-silicide film on the drain region and a third metal-silicide film on the gate electrode; and
   a second insulating film in contact with the side wall insulator and an upper surface of the third metal-silicide film,
   wherein a thickness of the first insulating film is 2 to 6 nm, and
   wherein a bottom surface of the side wall insulator is in contact with an upper surface of the first insulating film.

8. The semiconductor device according to claim 7, further comprising an LDD region in the semiconductor film, the LDD region being overlapped with the side wall insulator.

9. The semiconductor device according to claim 7, wherein the semiconductor film is a mono-domain crystalline semiconductor film.

10. The semiconductor device according to claim 7, wherein the first insulating film is a thermal oxide film.

11. The semiconductor device according to claim 7, wherein the gate electrode comprises polycrystalline silicon.

12. The semiconductor device according to claim 7, wherein the side wall insulator is made of silicon oxide or silicon nitride.

13. The semiconductor device according to claim 7, wherein the first metal-silicide film, the second metal-silicide film and the third metal-silicide film are selected from the group consisting of a titanium-silicide film, a tantalum-silicide film, a tungsten-silicide film and a molybdenum-silicide film.

14. A semiconductor device comprising:
   a substrate;
   a semiconductor film formed on and in contact with an insulating layer over the substrate;
   a first insulating film on the semiconductor film;
   a gate electrode over the first insulating film;
   a side wall insulator on a side surface of the gate electrode;
   a source region and a drain region in the semiconductor film;
   a first metal-silicide film on the source region, a second metal-silicide film on the drain region and a third metal-silicide film on the gate electrode;
   a second insulating film in contact with the side wall insulator and an upper surface of the third metal-silicide film; and
   a first wiring electrically connected with the source region through the first metal-silicide film, a second wiring electrically connected with the drain region through the second metal-silicide film and a third wiring electrically connected with the gate electrode through the third metal-silicide film,
   wherein a thickness of the first insulating film is 2 to 6 nm.

15. The semiconductor device according to claim 14, further comprising an LDD region in the semiconductor film, the LDD region being overlapped with the side wall insulator.

16. The semiconductor device according to claim 14, wherein the semiconductor film is a mono-domain crystalline semiconductor film.

17. The semiconductor device according to claim 14, wherein the first insulating film is a thermal oxide film.

18. The semiconductor device according to claim 14, wherein the gate electrode comprises polycrystalline silicon.

19. The semiconductor device according to claim 14, wherein the side wall insulator is made of silicon oxide or silicon nitride.

20. The semiconductor device according to claim 14, wherein the first metal-silicide film, the second metal-silicide film and the third metal-silicide film are selected from the group consisting of a titanium-silicide film, a tantalum-silicide film, a tungsten-silicide film and a molybdenum-silicide film.

21. The semiconductor device according to claim 14, wherein the second insulating film is a silicon oxide film.

22. A method of manufacturing a semiconductor device comprising:
   forming a semiconductor film on and in contact with an insulating layer over a substrate;
   forming a first insulating film of 2 to 6 nm thick on the semiconductor film;
   forming a gate electrode over the first insulating film;
   forming a side wall insulator on a side surface of the gate electrode;
   forming a metal-silicide film on the gate electrode;
   forming a second insulating film over the gate electrode and the side wall insulator wherein the second insulating film is in contact with an upper surface of the metal-silicide film; and
   forming a source region and a drain region in the semiconductor film by doping an impurity to the semiconductor film with the use of the gate electrode and the side wall insulator as a mask,
   wherein a bottom surface of the side wall insulator is in contact with an upper surface of the first insulating film.

23. The method of manufacturing the semiconductor device according to claim 22, further comprising forming an LDD region in the semiconductor film, the LDD region being overlapped with the side wall insulator.

24. The method of manufacturing the semiconductor device according to claim 22, wherein the semiconductor film is a mono-domain crystalline semiconductor film.

25. The method of manufacturing the semiconductor device according to claim 22, wherein the first insulating film is a thermal oxide film.

26. The method of manufacturing the semiconductor device according to claim 22, wherein the gate electrode comprises polycrystalline silicon.

27. The method of manufacturing the semiconductor device according to claim 22, wherein the side wall insulator is made of silicon oxide or silicon nitride.

28. A method of manufacturing a semiconductor device comprising:
   forming a semiconductor film on and in contact with an insulating layer over a substrate;
   forming a first insulating film of 2 to 6 nm thick on the semiconductor film;
   forming a gate electrode over the first insulating film;
   forming a metal-silicide film on the gate electrode;
   forming a side wall insulator on a side surface of the gate electrode;
   forming a second insulating film over the gate electrode and the side wall insulator wherein the second insulating film is in contact with an upper surface of the metal-silicide film;
   forming a source region and a drain region in the semiconductor film by doping an impurity to the semiconductor film with the use of the gate electrode and the side wall insulator as a mask; and forming metal-silicide films on the source region, the drain region and the gate electrode by heating, wherein a bottom surface of the side wall insulator is in contact with an upper surface of the first insulating film.

29. The method of manufacturing the semiconductor device according to claim 28, further comprising forming an LDD region in the semiconductor film, the LDD region being overlapped with the side wall insulator.

30. The method of manufacturing the semiconductor device according to claim 28, wherein the semiconductor film is a mono-domain crystalline semiconductor film.

31. The method of manufacturing the semiconductor device according to claim 28, wherein the first insulating film is a thermal oxide film.

32. The method of manufacturing the semiconductor device according to claim 28, wherein the gate electrode comprises polycrystalline silicon.

33. The method of manufacturing the semiconductor device according to claim 28, wherein the side wall insulator is made of silicon oxide or silicon nitride.

34. The method of manufacturing the semiconductor device according to claim 28, wherein the metal-silicide films are selected from the group consisting of a titanium-silicide film, a tantalum-silicide film, a tungsten-silicide film and a molybdenum-silicide film.

35. A method of manufacturing a semiconductor device comprising:

forming a semiconductor film on and in contact with an insulating layer over a substrate;

forming a first insulating film of 2 to 6 nm thick on the semiconductor film;

forming a gate electrode over the first insulating film;

forming a side wall insulator on a side surface of the gate electrode;

forming a source region and a drain region in the semiconductor film by doping an impurity to the semiconductor film with the use of the gate electrode and the side wall insulator as a mask;

forming a first metal-silicide film on the source region, a second metal-silicide film on the drain region and a third metal-silicide film on the gate electrode;

forming a second insulating film over the semiconductor film, the gate electrode and the side wall insulator wherein the second insulating film is in contact with an upper surface of the third metal-silicide film; and forming a first wiring electrically connected with the source region through the first metal-silicide film, a second wiring electrically connected with the drain region through the second metal-silicide film and a third wiring electrically connected with the gate electrode through the third metal-silicide film.

36. The method of manufacturing the semiconductor device according to claim 35, further comprising forming an LDD region in the semiconductor film, the LDD region being overlapped with the side wall insulator.

37. The method of manufacturing the semiconductor device according to claim 35, wherein the semiconductor film is a mono-domain crystalline semiconductor film.

38. The method of manufacturing the semiconductor device according to claim 35, wherein the first insulating film is a thermal oxide film.

39. The method of manufacturing the semiconductor device according to claim 35, wherein the gate electrode comprises polycrystalline silicon.

40. The method of manufacturing the semiconductor device according to claim 35, wherein the side wall insulator is made of silicon oxide or silicon nitride.

41. The method of manufacturing the semiconductor device according to claim 35, wherein the first metal-silicide film, the second metal-silicide film and the third metal-silicide film are selected from the group consisting of a titanium-silicide film, a tantalum-silicide film, a tungsten-silicide film and a molybdenum-silicide film.

42. The method of manufacturing the semiconductor device according to claim 35, wherein the second insulating film is a silicon oxide film.

* * * * *